(12) United States Patent
Seo et al.

(10) Patent No.: US 8,384,283 B2
(45) Date of Patent: Feb. 26, 2013

(54) LIGHT-EMITTING ELEMENT, LIGHT-EMITTING DEVICE, AND ELECTRONIC DEVICE

(75) Inventors: Satoshi Seo, Kanagawa (JP); Tsunenori Suzuki, Kanagawa (JP); Kaoru Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 914 days.

(21) Appl. No.: 12/212,290

(22) Filed: Sep. 17, 2008

(65) Prior Publication Data

US 2009/0079326 A1    Mar. 26, 2009

(30) Foreign Application Priority Data

Sep. 20, 2007   (JP) ................. 2007-243273

(51) Int. Cl.
*H01L 33/00*   (2010.01)
(52) U.S. Cl. ................. 313/499; 257/E33.001
(58) Field of Classification Search .............. 313/499, 313/500–504, 506
See application file for complete search history.

(56) References Cited

U.S. PATENT DOCUMENTS

| | | | |
|---|---|---|---|
| 5,792,557 A | 8/1998 | Nakaya et al. | |
| 6,387,546 B1 | 5/2002 | Hamada et al. | |
| 6,465,953 B1 | 10/2002 | Duggal | |
| 6,750,472 B2 | 6/2004 | Suzuki et al. | |
| 7,196,360 B2 | 3/2007 | Seo et al. | |
| 7,342,355 B2 | 3/2008 | Seo et al. | |
| 7,456,425 B2 | 11/2008 | Seo et al. | |
| 7,592,193 B2 | 9/2009 | Yamazaki et al. | |
| 7,854,998 B2 | 12/2010 | Nagara et al. | |
| 7,888,865 B2 | 2/2011 | Iwakuma et al. | |

(Continued)

FOREIGN PATENT DOCUMENTS

| | | |
|---|---|---|
| EP | 1 565 041 A1 | 8/2005 |
| EP | 1 667 494 A1 | 6/2006 |

(Continued)

OTHER PUBLICATIONS

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

(Continued)

*Primary Examiner* — Anh Mai
*Assistant Examiner* — Brenitra M Lee
(74) *Attorney, Agent, or Firm* — Husch Blackwell LLP

(57) ABSTRACT

It is an object of the present invention to provide a light-emitting element with high light emission efficiency. It is another object of the present invention to provide a light-emitting element with a long lifetime. A light-emitting device is provided, which includes a light-emitting layer, a first layer, and a second layer between first electrode and a second electrode, wherein the first layer is provided between the light-emitting layer and the first electrode, the second layer is provided between the light-emitting layer and the second electrode, the first layer is a layer for controlling the hole transport, the second layer is a layer for controlling the electron transport, and a light emission from the light-emitting layer is obtained when voltage is applied to the first electrode and the second electrode so that potential of the first electrode is higher than potential of the second electrode.

42 Claims, 14 Drawing Sheets

U.S. PATENT DOCUMENTS

| | | | |
|---|---|---|---|
| 7,986,090 | B2 | 7/2011 | Pfeiffer et al. |
| 8,067,885 | B2 | 11/2011 | Kashiwabara |
| 2001/0051284 | A1 | 12/2001 | Ueda et al. |
| 2001/0052751 | A1 | 12/2001 | Wakimoto et al. |
| 2002/0105005 | A1 | 8/2002 | Seo et al. |
| 2002/0139303 | A1 | 10/2002 | Yamazaki et al. |
| 2004/0001969 | A1 | 1/2004 | Cosimbescu et al. |
| 2004/0058193 | A1 | 3/2004 | Hatwar |
| 2004/0142209 | A1 | 7/2004 | Toguchi et al. |
| 2005/0100760 | A1 | 5/2005 | Yokoyama |
| 2006/0011908 | A1 | 1/2006 | Ohsawa et al. |
| 2006/0043859 | A1 | 3/2006 | Fukuoka et al. |
| 2006/0158102 | A1 | 7/2006 | Kawamura et al. |
| 2007/0040161 | A1* | 2/2007 | Kumaki et al. ............ 257/13 |
| 2007/0172699 | A1 | 7/2007 | Nakashima et al. |
| 2007/0182318 | A1* | 8/2007 | Kumaki et al. ............ 313/506 |
| 2007/0215889 | A1* | 9/2007 | Kawakami et al. ......... 257/94 |
| 2008/0006821 | A1 | 1/2008 | Suzuki et al. |
| 2008/0006822 | A1* | 1/2008 | Ohsawa ...................... 257/40 |
| 2008/0007164 | A1 | 1/2008 | Suzuki et al. |
| 2008/0007165 | A1 | 1/2008 | Suzuki et al. |
| 2008/0017853 | A1* | 1/2008 | Egawa et al. ................ 257/40 |
| 2009/0051274 | A1 | 2/2009 | Hayashi |
| 2009/0058285 | A1 | 3/2009 | Yamazaki et al. |
| 2009/0072725 | A1 | 3/2009 | Suzuki et al. |
| 2009/0079337 | A1 | 3/2009 | Seo et al. |
| 2009/0191781 | A1 | 7/2009 | Ishida et al. |
| 2009/0206331 | A1 | 8/2009 | Seo et al. |
| 2009/0317733 | A1 | 12/2009 | Okura et al. |
| 2010/0133523 | A1 | 6/2010 | Nowatari et al. |
| 2010/0181898 | A1 | 7/2010 | Nakamura et al. |

FOREIGN PATENT DOCUMENTS

| | | | |
|---|---|---|---|
| EP | 1 729 545 | A1 | 12/2006 |
| EP | 1 755 362 | A1 | 2/2007 |
| JP | 3-190088 | | 8/1991 |
| JP | 2000-68057 | | 3/2000 |
| JP | 2002-302757 | | 10/2002 |
| JP | 2002-313584 | | 10/2002 |
| JP | 2003-151776 | | 5/2003 |
| JP | 2004-221045 | | 8/2004 |
| JP | 2004-273163 | | 9/2004 |
| JP | 2005-100921 | | 4/2005 |
| JP | 2006-73636 | | 3/2006 |
| JP | 2006-156888 | | 6/2006 |
| WO | WO 2004/047499 | A1 | 6/2004 |
| WO | WO 2005/091685 | A1 | 9/2005 |
| WO | WO 2005/117499 | A1 | 12/2005 |
| WO | WO 2006/059512 | A1 | 6/2006 |
| WO | WO 2006/059736 | A1 | 6/2006 |
| WO | WO 2006/097064 | A1 | 9/2006 |

OTHER PUBLICATIONS

Goldsmith, C.R. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi.T et al, "A Method of Measuring an Energy Level," High Molecular EL Materials—Development of Light-Emitting High Molecular Compounds, Kyoritsu Shuppan, Dec. 25, 2004, pp. 64-67 (with English translation, pp. 1-3).

Cina, S. et al, "P-135: Efficient Electron Injection from PEDOT-PSS into a Graded-n-Doped Electron Transporting Layer in an Inverted OLED Structure," SID 05 Digest: SID International Symposium Digest of Technical Papers, vol. 36, 2005, pp. 819-821.

Lee, M-T et al, "Improved Stability of Organic Electroluminescent Devices by Doping Styrylamines in Hole or Electron Transporting Layer," Applied Physics Letters, vol. 86, No. 10, 2005, pp. 103501-1-103501-3.

European Search Report re application No: EP 07012956.4, dated Oct. 5, 2007.

* cited by examiner

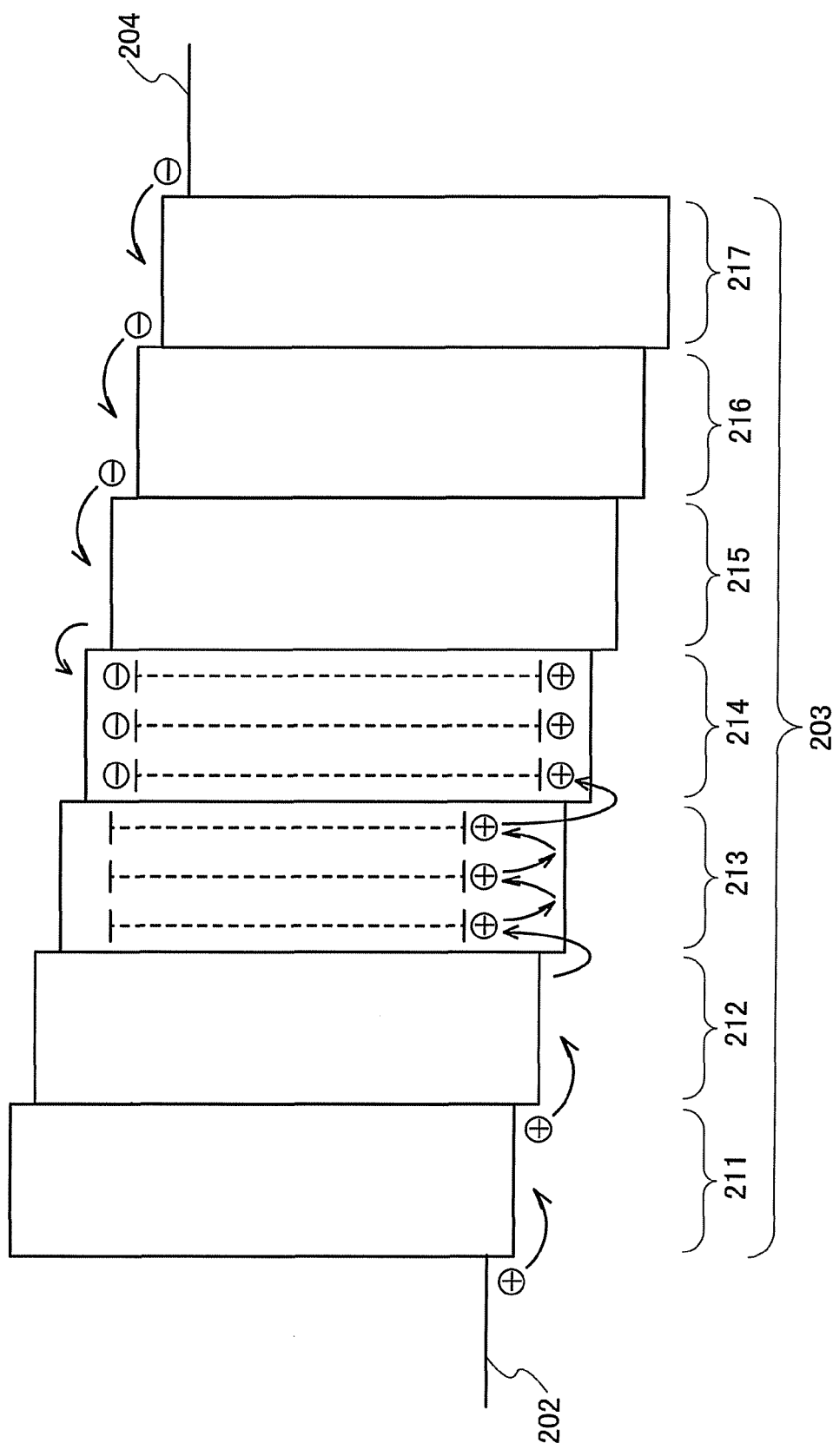

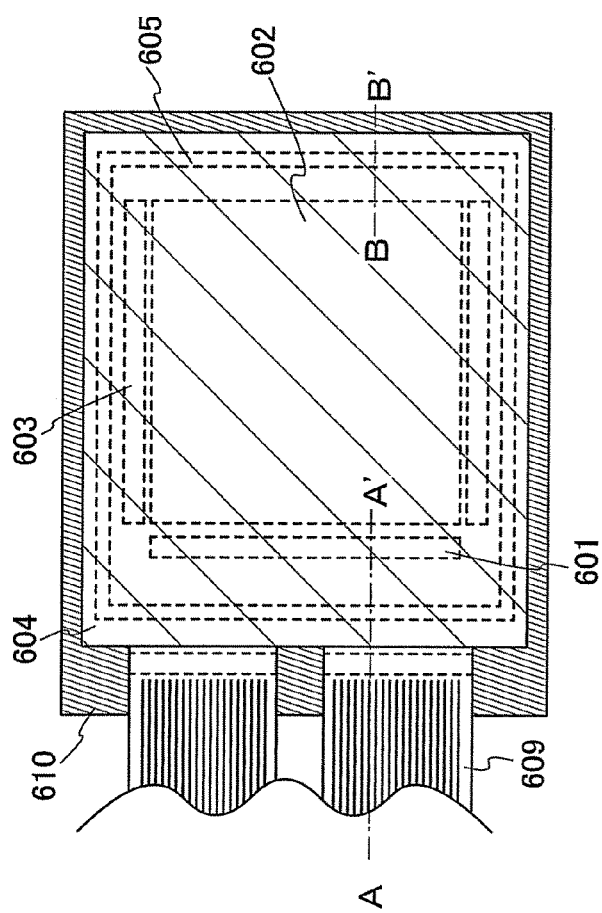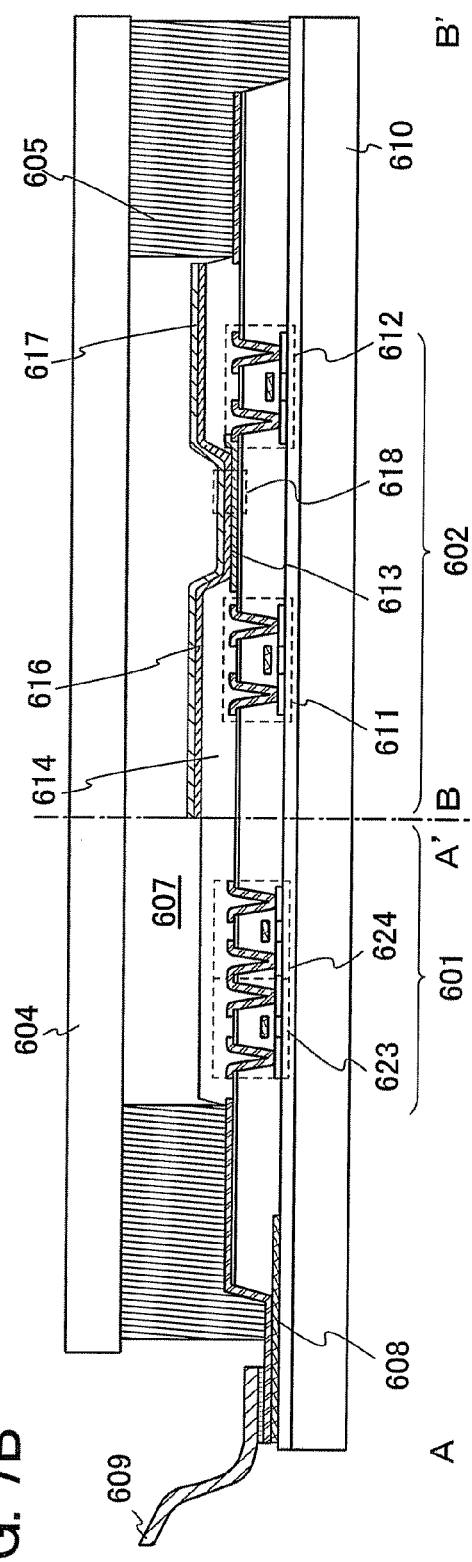
FIG. 7A
FIG. 7B

LIGHT-EMITTING ELEMENT, LIGHT-EMITTING DEVICE, AND ELECTRONIC DEVICE

BACKGROUND OF THE INVENTION

1. Field of the Invention

The present invention relates to a current excitation type light-emitting element. In addition, the present invention relates to a light-emitting device and an electronic device each having the light-emitting element.

2. Description of the Related Art

In recent years, research and development have been extensively conducted on light-emitting elements using electroluminescence. In a basic structure of such a light-emitting element, a substance having a light-emitting property is interposed between a pair of electrodes. By applying voltage to this element, light emission can be obtained from the substance having a light-emitting property.

Since such a light-emitting element is a self-light-emitting type, it has advantages over a liquid crystal display such as higher visibility of a pixel and unnecessity of a backlight. Accordingly, such a light-emitting element is considered suitable as a flat panel display element. In addition, other advantages of such a light-emitting element are that it can be manufactured to be thin and lightweight and the response speed is very high.

Furthermore, since such a light-emitting element can be formed into a film shape, surface light emission can be easily obtained by forming a large-area element. This is a feature that is difficult to be obtained from a point light source typified by a filament lamp and an LED or a linear light source typified by a fluorescent light. Therefore, the light-emitting element has a high utility value as a plane light source that can be applied to lighting or the like.

Light-emitting elements using electroluminescence are classified broadly according to whether they use an organic compound or an inorganic compound as a substance having a light-emitting property.

When an organic compound is used as a substance having a light-emitting property, electrons and holes are injected into a layer including an organic compound having a light-emitting property from a pair of electrodes by voltage application to a light-emitting element, so that current flows therethrough. Then, these carriers (electrons and holes) are recombined; thus, the organic compound having a light-emitting property is brought into an excited state. The organic compound having a light-emitting property returns to a ground state from the excited state, thereby emitting light. Based on this mechanism, such a light-emitting element is referred to as a current-excitation light-emitting element.

Note that the excited state of an organic compound can be a singlet excited state or a triplet excited state, and light emission from the singlet excited state is referred to as fluorescence and light emission from the triplet excited state is referred to as phosphorescence.

As for such a light-emitting element, there are many problems depending on materials in improving element characteristics, and improvement in element structure, development of materials, and the like have been conducted to overcome the problems.

For example, in Non-Patent Document 1 (Tetsuo TSUTSUI, and eight others, Japanese Journal of Applied Physics vol. 38, L1502 to L1504, (1999)), a hole-blocking layer is provided so that a light-emitting element using a phosphorescent material efficiently emits light. However, as described in Non-Patent Document 1, a hole-blocking layer has poor durability, and the light-emitting element has a very short lifetime. Thus, development of a light-emitting element with high light emission efficiency and a long lifetime has been desired.

SUMMARY OF THE INVENTION

In view of the foregoing problems, it is an object of the present invention to provide a light-emitting element with high light emission efficiency; a light-emitting element with a long lifetime; a light-emitting device and an electronic device with high light emission efficiency; and a light-emitting device and an electronic device with a long lifetime.

As a result of diligent studies, the present inventors have found that a light-emitting element with high light emission efficiency can be obtained by providing a layer for controlling the carrier transport. In addition, the present inventors have also found that a light-emitting element with a long lifetime can be obtained.

One aspect of the present invention is a light-emitting element including a light-emitting layer, a first layer, and a second layer between a first electrode and a second electrode, wherein the first layer is provided between the light-emitting layer and the first electrode, the second layer is provided between the light-emitting layer and the second electrode, the first layer includes a first organic compound and a second organic compound, in the first layer the weight percent of the first organic compound is higher than the weight percent of the second organic compound, the first organic compound is an organic compound having a hole-transporting property, the second organic compound is an organic compound having a hole-trapping property, the second layer includes a third organic compound and a fourth organic compound, in the second layer the weight percent of the third organic compound is higher than the weight percent of the fourth organic compound, the third organic compound is an organic compound having an electron-transporting property, the fourth organic compound is an organic compound having a hole-transporting property, and when voltage is applied to the first electrode and the second electrode so that potential of the first electrode is higher than potential of the second electrode, light emission from the light-emitting layer can be obtained.

In the above structure, the highest occupied molecular orbital level of the second organic compound is preferably higher than the highest occupied molecular orbital level of the first organic compound by 0.3 eV or more.

In the above structure, the first organic compound is preferably an aromatic amine compound.

In the above structure, the thickness of the first layer is preferably from 5 nm to 20 nm, inclusive.

In the above structure, the first layer and the light-emitting layer are preferably provided to be in contact with each other.

In the above structure, the difference between the lowest unoccupied molecular orbital levels of the third organic compound and the fourth organic compound is preferably less than 0.3 eV.

In the above structure, the third organic compound is preferably a metal complex, and the fourth organic compound is preferably an aromatic amine compound.

In the above structure, when the magnitude of the dipole moment of the third organic compound is $P_1$ and the magnitude of the dipole moment of the fourth organic compound is $P_2$, a relation of $P_1/P_2 \geqq 3$ or $P_1/P_2 \leqq 0.33$ is preferably satisfied.

In the above structure, the thickness of the second layer is preferably from 5 nm to 20 nm, inclusive.

In the above structure, the second layer and the light-emitting layer are preferably provided to be in contact with each other.

Moreover, the present invention includes a light-emitting device having the above-described light-emitting element. The light-emitting device in this specification includes an image display device, a light-emitting device, or a light source (including a lighting device). Further, the following are also referred to as a light-emitting device: a module in which a connector, for example, an FPC (flexible printed circuit), a TAB (tape automated bonding) tape, or a TCP (tape carrier package) is attached to a panel provided with a light-emitting element; a module provided with a printed wiring board at the end of the TAB tape or the TCP; and a module in which an IC (integrated circuit) is directly mounted to a light-emitting element by a COG (chip on glass) method.

Further, an electronic device using the light-emitting element of the present invention in its display portion is also included in the present invention. Consequently, one feature of an electronic device of the present invention is to include a display portion which is provided with the above-described light-emitting element and a control means to control light emission of the light-emitting element.

In the light-emitting element of the present invention, a layer for controlling the carrier transport is provided; thus, a light-emitting element with high light emission efficiency can be obtained. Furthermore, a light-emitting element with a long lifetime can be obtained.

Further, the light-emitting element of the present invention is applied to a light-emitting device and an electronic device, whereby a light-emitting device and an electronic device with high light emission efficiencies and reduced power consumptions can be obtained. In addition, a light-emitting device and an electronic device with a long lifetime can be obtained.

BRIEF DESCRIPTION OF THE DRAWINGS

FIG. 4 is a diagram illustrating a light-emitting element of the present invention.

FIGS. 7A and 7B are diagrams illustrating a light-emitting device of the present invention.

DETAILED DESCRIPTION OF THE INVENTION

Figure 1A:
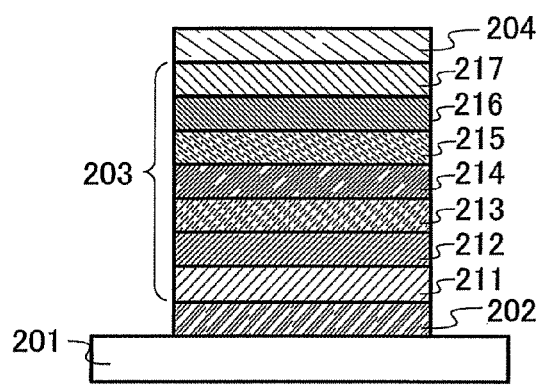
FIGS. 1A to 1D are diagrams each illustrating a light-emitting element of the present invention.

The embodiment modes according to the present invention are hereinafter described in detail with reference to the drawings. However, the present invention is not limited to the following description, and it is easily understood by those skilled in the art that the mode and detail can be variously changed without departing from the scope and spirit of the present invention. Therefore, the present invention is not interpreted as being limited to the following description of the embodiment modes.

Embodiment Mode 1

One mode of a light-emitting element according to the present invention is hereinafter described with reference to FIGS. 1A to 1D. A light-emitting element according to the present invention has a layer for controlling the hole transport and a layer for controlling the electron transport.

A light-emitting element of the present invention has a plurality of layers between a pair of electrodes. The plurality of layers are a combination of layers formed of a substance having a high carrier-injecting property and a substance having a high carrier-transporting property which are stacked so that a light-emitting region is formed in a region away from the electrodes, that is, recombination of carriers is performed in an area away from the electrodes.

In this embodiment mode, a light-emitting element includes a first electrode 202, a second electrode 204, and an EL layer 203 provided between the first electrode 202 and the second electrode 204. Note that this embodiment mode is described below on the assumption that the first electrode 202 serves as an anode and the second electrode 204 serves as a cathode. That is, this embodiment mode is described below on the assumption that, when voltage is applied to the first electrode 202 and the second electrode 204 so that potential of the first electrode 202 is higher than potential of the second electrode 204, light emission can be obtained.

A substrate 201 is used as a support of the light-emitting element. For the substrate 201, glass, plastic, or the like can be used, for example. Note that other materials may also be used as long as they serve as a support in a manufacturing process of the light-emitting element.

As for the first electrode 202, a metal, an alloy, a conductive compound, a mixture thereof, or the like having a high work function (specifically, preferably 4.0 eV or higher) is preferably used. For example, indium tin oxide (ITO), indium tin oxide containing silicon or silicon oxide, indium zinc oxide (IZO), indium oxide containing tungsten oxide and zinc oxide (IWZO), and the like can be given. A film of such a conductive metal oxide is generally formed by sputtering, but may also be formed by an inkjet method, a spin coating method, or the like by application of a sol-gel method or the like. For example, a film of indium zinc oxide (IZO) can be formed by a sputtering method using a target in which zinc oxide is added into indium oxide at 1 to 20 wt %. In addition, a film of indium oxide containing tungsten oxide and zinc oxide (IWZO) can be formed by a sputtering method using a target in which tungsten oxide and zinc oxide are included in indium oxide at 0.5 to 5 wt % and at 0.1 to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), and the like can be given.

In a case where a layer including a composite material described below is used as a layer in contact with the first electrode, various metals, alloys, electrically conductive compounds, or a mixture thereof can be used for the first electrode regardless of the work function. For example, aluminum (Al), silver (Ag), an alloy containing aluminum (AlSi), or the like can be used. Besides, any of the following materials with a low work function can be used for the first electrode: elements belonging to Group 1 and Group 2 of the periodic table, that is, alkali metals such as lithium (Li) and cesium (Cs) and alkaline earth metals such as magnesium (Mg), calcium (Ca), and strontium (Sr); alloys thereof (MgAg, AlLi); rare earth metals such as europium (Eu) and ytterbium (Yb); alloys thereof; and the like. A film of an alkali metal, an alkaline earth metal, or an alloy thereof can be formed by a vacuum evaporation method. In addition, a film of an alloy including an alkali metal or an alkaline earth metal can be formed by a sputtering method. Further, a film can be formed using a silver paste or the like by an inkjet method or the like.

The EL layer 203 shown in this embodiment mode includes a hole-injecting layer 211, a hole-transporting layer 212, a layer 213 for controlling the hole transport, a light-emitting layer 214, a layer 215 for controlling the electron transport, an electron-transporting layer 216, and an electron-injecting layer 217. Note that it is acceptable as long as the EL layer 203 includes a layer for controlling the carrier transport and a light-emitting layer shown in this embodiment mode. Thus, the structure of the other stacked layers is not specifically limited. That is, there is no particular limitation on the stacked structure of the EL layer 203, and a layer for controlling the carrier transport and a light-emitting layer shown in this embodiment mode may be combined with a layer formed of a substance having a high electron-transporting property, a substance having a high hole-transporting property, a substance having a high electron-injecting property, a substance having a high hole-injecting property, a bipolar substance (a substance having high electron-transporting and hole-transporting properties), or the like. For example, the EL layer 203 can be formed by an appropriate combination of a hole-injecting layer, a hole-transporting layer, a light-emitting layer, an electron-transporting layer, an electron-injecting layer, and the like. Specific materials for each of the layers are given below.

The hole-injecting layer 211 is a layer including a substance having a high hole-injecting property. As a substance having a high hole-injecting property, molybdenum oxide, vanadium oxide, ruthenium oxide, tungsten oxide, manganese oxide, or the like can be used. Besides, as a low molecular organic compound, a phthalocyanine-based compound such as phthalocyanine (abbreviation: H$_2$Pc), copper(II)phthalocyanine (abbreviation: CuPc), or vanadyl phthalocyanine (VOPc); an aromatic amine compound such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1); or the like can be given.

Alternatively, for the hole-injecting layer 211, a composite material in which a substance having an acceptor property is mixed into a substance having a high hole-transporting property can be used. Note that by using a material in which a substance having an acceptor property is mixed into a substance having a high hole-transporting property, a material for forming the electrode can be selected regardless of its work function. In other words, besides a material with a high work function, a material with a low work function may also be used as the first electrode 202. A composite material of those substances can be formed by co-evaporation of a substance having a high hole-transporting property and a substance having an acceptor property.

Note that in this specification, "composition" refers to not only a state where two materials are simply mixed but also a state where a plurality of materials are mixed and charge is given and received between the materials.

As an organic compound used for the composite material, various compounds such as an aromatic amine compound, a carbazole derivative, aromatic hydrocarbon, and a high molecular compound (oligomer, dendrimer, polymer, or the like) can be used. Note that the organic compound used for the composite material is preferably an organic compound having a high hole-transporting property. Specifically, a substance having a hole mobility of $10^{-6}$ cm$^2$/Vs or higher is preferably used. However, other substances may also be used as long as the hole-transporting properties thereof are higher than the electron-transporting properties thereof. Examples of an organic compound that can be used for the composite material are specifically listed below.

As the organic compound which can be used for the composite material, for example, an aromatic amine compound such as MTDATA, TDATA, DPAB, DNTPD, DPA3B, PCzPCA1 PCzPCA2, PCzPCN1, 4,4'-bis[N-(1-naphthyl)-N-phenylamino]biphenyl (abbreviation: NPB or α-NPD), or N,N'-bis(3-methylphenyl)-N,N'-diphenyl-[1,1'-biphenyl]-4,4'-diamine (abbreviation: TPD); a carbazole derivative such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), or 1,4-bis[4-(N-carbazolyl)phenyl]-2,3,5,6-tetraphenylbenzene; or an aromatic hydrocarbon compound such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be given.

As the substance having an acceptor property, an organic compound such as 7,7,8,8-tetracyano-2,3,5,6-tetrafluoro-quinodimethane (abbreviation: F$_4$-TCNQ) or chloranil; or a transition metal oxide can be given. In addition, oxide of metals that belong to Group 4 to Group 8 of the periodic table can be given as the substance having an acceptor property. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable since it is stable in the air and its hygroscopic property is low so that it can be easily handled.

Further, for the hole-injecting layer 211, a high molecular compound (an oligomer, a dendrimer, a polymer, or the like) can be used. For example, a high molecular compound such as poly(N-vinylcarbazole) (abbreviation: PVK), poly(4-vinyltriphenylamine) (abbreviation: PVTTA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine (abbreviation: Poly-TPD) can be given. In addition, a high molecular compound to which acid is added. As an example of acid, poly(3,4-ethylenedioxythiophene)/poly(styrenesulfonic acid) (PEDOT/PSS), polyaniline/poly(styrenesulfonic acid) (PAni/PSS), or the like can be used.

Further, a composite material formed by using the above-mentioned high molecular compound such as PVK, PVTPA, PTPDMA, or Poly-TPD and the above-mentioned substance having an acceptor property can be used for the hole-injecting layer 211.

The hole-transporting layer 212 is a layer including a substance having a high hole-transporting property. As a substance having a high hole-transporting property, an aromatic amine compound such as NPB (or α-NPD), TPD, 4,4'-bis[N-(9,9-dimethylfluoren-2-yl)-N-phenylamino]biphenyl (abbreviation: DFLDPBi), 4,4'-bis[N-(spiro-9,9'-bifluoren-2-yl)-N-phenylamino]biphenyl (abbreviation: BSPB), or the like can be given as the low molecular organic compound. The substances mentioned here mainly have a hole mobility of $10^{-6}$ cm$^2$/Vs or higher. However, other substances may also be used as long as the hole-transporting properties thereof are higher than the electron-transporting properties thereof. Note that the layer including a substance having a high hole-transporting property is not limited to a single layer, but two or more layers including any of the above-mentioned substances may be stacked.

Further, for the hole-transporting layer 212, a high molecular compound such as PVK, PVTPA, PTPDMA, or Poly-TPD can be used.

The layer 213 for controlling the hole transport shown in this embodiment mode includes the first organic compound and the second organic compound, in which the weight percent of the first organic compound is higher than that of the second organic compound. That is, the second organic compound is dispersed into the first organic compound. The layer 213 for controlling the hole transport is preferably provided between the light-emitting layer 214 and the first electrode 202.

In a case where the layer for controlling the hole transport is provided, the first organic compound is preferably an organic compound having a hole-transporting property. That is, the first organic compound is preferably a substance whose hole-transporting property is higher than the electron-transporting property.

On the other hand, the second organic compound is preferably an organic compound having a function of trapping holes. That is, the second organic compound is preferably an organic compound whose highest occupied molecular orbital (HOMO) level is higher than that of the first organic compound by 0.3 eV or more.

Since the second organic compound is included, the hole-transporting rate of the layer for controlling the hole transport as a whole is lower than that of a layer including only the first organic compound. That is, by adding the second organic compound, the carrier transport can be controlled. Further, by control of the concentration of the second organic compound, the carrier-transporting rate can be controlled. Specifically, the concentration of the second organic compound is preferably from 0.1 wt % to 5 wt % or from 0.1 mol % to 5 mol %.

FIG. 4 exemplarily illustrates a band diagram of a light-emitting element of the present invention in FIG. 1A. In FIG. 4, electrons injected from the second electrode 204 pass through the electron-injecting layer 217 and the electron-transporting layer 216, and are injected into the layer 215 for controlling the electron transport. On the other hand, the holes injected from the first electrode 202 pass through the hole-injecting layer 211 and the hole-transporting layer 212, and are injected into the layer 213 for controlling the hole transport. The transport of the holes injected into the layer for controlling the hole transport is retarded by the second organic compound having a hole-trapping property. The holes of which transport is retarded are injected into the light-emitting layer 214, and then recombined with holes. Thus, light emission is obtained.

As the second organic compound, for example, CuPc, DNTPD, DPAB, bis(2-phenylpyridinato-N,C$^{2'}$)iridium(III) acetylacetonate (abbreviation: Ir(Ppy)$_2$(acac)), (acetylacetonato)bis[10-(2-pyridyl)phenoxazinato]iridium(III) (abbreviation: Ir(ppx)$_2$(acac)), tris(2-phenylpyridinato-N,C$^{2'}$) iridium(III), (abbreviation: Ir(ppy)$_3$), bis[2-(2'-benzo[4,5-α]thienyl)pyridinato-N,C$^{3'}$]iridium(III)acetylacetonate (abbreviation: Ir(btp)$_2$(acac)), N,N''-(2-tert-butylanthracene-9,10-diyldi-4,1-phenylene)bis[N,N',N'-triphenyl-1,4-phenylenediamine] (abbreviation: DPABPA), or the like can be given.

The above-described compounds are compounds having particularly high HOMO levels among compounds that are used for light-emitting elements. Thus, when such compounds are added to the first organic compound which will be described later, an excellent hole-trapping property is exhibited. Note that it is preferable that emission colors of the light-emitting layer and the second organic compound be similar colors. In this manner, even if the second organic compound unintendedly emits light, the color purity of the light-emitting elements can be kept.

In addition, the first organic compound included in the layer 213 for controlling the hole transport is an organic compound having a hole-transporting property. That is, the first organic compound is a substance whose hole-transporting property is higher than the electron-transporting property. Specifically, a condensed aromatic hydrocarbon such as 9,10-diphenylanthracene (abbreviation: DPAnth) or 6,12-dimethoxy-5,11-diphenylchrysene can be given.

In addition, an aromatic amine compound such as N,N-diphenyl-9-[4-(10-phenyl-9-anthryl)phenyl]-9H-carbazol-3-amine (abbreviation: CzA1PA), 4-(10-phenyl-9-anthryl) triphenylamine (abbreviation: DPHPA), N,9-diphenyl-N-[4-(10-phenyl-9-anthryl)phenyl]-9H-carbazole-3-amine (abbreviation: PCAPA), N,9-diphenyl-N-{4-[4-(10-phenyl-9-anthryl)phenyl]phenyl}-9H-carbazol-3-amine] (abbreviation: PCAPBA), N-(9,10-diphenyl-2-anthryl)-N,9-diphenyl-9H-carbazol-3-amine, (abbreviation: 2PCAPA), NPB (or α-NPD), TPD, DFLDPBi, BSPB, or 2,3-bis{4-[N-(4-biphenylyl)-N-phenylamino]phenyl}quinoxaline (abbreviation: BPAPQ) can be given. Further, a high molecular compound such as PVK, PVTPA, PTPDMA, or Poly-TPD can be used.

Above all, an aromatic amine compound that is stable against holes is preferably used. In addition, as described above, in this embodiment mode, the second organic compound should be a compound having a hole-trapping property. Therefore, the HOMO level of the second organic compound is preferably higher than that of the first organic compound by 0.3 eV or more. Therefore, it is acceptable as long as the first organic compound is appropriately selected according to the kind of compound used for the second organic compound so as to satisfy the above condition.

Note that it is preferable that the emission colors of the second organic compound included in the layer 213 for controlling the hole transport and a substance having a high light-emitting property included in the light-emitting layer 214 be similar colors. Specifically, it is preferable that the difference between the wavelength of the maximum peak of the emission spectrum of the second organic compound and that of the substance having a high light-emitting property be 30 nm or less. When the difference between the wavelength of the maximum peak of the emission spectrum of the second organic compound and that of the substance having a high light-emitting property is 30 nm or less, the emission colors of the substance having a high light-emitting property and the second organic compound can be similar colors. Accordingly, even in a case where the second organic compound emits light due to change of voltage or the like, change in emission color can be suppressed.

However, the second organic compound has no necessity to emit light. For example, in a case where light emission efficiency of the substance having a high light-emitting property is higher than that of the second organic compound, the concentration of the second organic compound in the layer 213 for controlling the hole transport is preferably adjusted (the concentration is slightly lowered so that light emission from the second organic compound is suppressed) so that only light emitted from the substance having a high light-emitting property is substantially obtained. In that case, the emission colors of the substance having a high light-emitting property and the second organic compound are similar colors (i.e., they have about the same level of energy gap). Therefore, there is little possibility that energy will transfer from the substance having a high light-emitting property toward the second organic compound, and thus high light emission efficiency can be obtained.

In addition, the thickness of the layer 213 for controlling the hole transport is preferably from 5 nm to 20 nm, inclusive. When the thickness is too large, the carrier-transporting rate becomes too slow, which could result in high driving voltage. When the thickness is too small, on the other hand, it is impossible to implement the function of controlling the carrier transport. Therefore, the thickness is preferably from 5 nm to 20 nm, inclusive.

In a case of a conventional element where a layer for controlling the hole transport is not provided, holes injected from the first electrode pass through a hole-injecting layer and a hole-transporting layer to be injected into a light-emitting layer. If the light-emitting layer has a hole-transporting property, that is, if the material which has the highest weight percent in the light-emitting layer has a hole-transporting property, holes injected into the light-emitting layer transfer through the light-emitting layer, and may reach an electron-transporting layer. When holes reach the electron-transporting layer, materials which are included in the electron-transporting layer are degraded, leading deterioration of the light-emitting element.

However, by providing the layer for controlling the hole transport shown in this embodiment mode, holes that penetrate the light-emitting layer and reach the electron-transporting layer can be suppressed. Therefore, deterioration of the electron-transporting layer, which is caused because holes reach the electron-transporting layer, can be suppressed. Thus, deterioration of the light-emitting element can be prevented, and the light-emitting element with a long lifetime can be obtained.

On the other hand, in a case of a conventional element where the layer for controlling the hole transport is not provided, most of the holes injected from the first electrode are injected into the light-emitting layer without the transport being controlled. If the light-emitting layer has an electron-transporting property, that is, if the material which has the highest weight percent in the light-emitting layer has an electron-transporting property, a light-emitting region is formed in the vicinity of the interface between the light-emitting layer and the hole-transporting layer. In addition, there is a possibility that cations are generated by excessive holes in the vicinity of the interface between the light-emitting layer and the hole-transporting layer. Since a cation serves as a quencher, light emission efficiency decreases due to cations generated in the vicinity of the light-emitting region.

However, by providing the layer for controlling the hole transport shown in this embodiment mode, formation of cations generated by excessive holes in the light-emitting layer and in the vicinity of the light-emitting layer can be suppressed, and decrease in light emission efficiency can be suppressed. Therefore, a light-emitting element with high light emission efficiency can be obtained.

As described above, by controlling the hole transport, the carrier balance is improved. As a result, the recombination probability of holes and electrons is improved, thereby high light emission efficiency can be obtained. Note that as shown in this embodiment mode, a structure in which the layer for controlling the hole transport is provided between the light-emitting layer and the first electrode serving as an anode is particularly effective for a light-emitting element having excessive holes. This is because the transport of excessive holes can be suppressed and controlled so that the balance of holes and electrons can be achieved by providing the layer for controlling the hole transport in the light-emitting element having excessive holes.

The light-emitting layer 214 is a layer including a substance having a high light-emitting property, and various materials can be used for the light-emitting layer. For example, as a substance having a high light-emitting property, a fluorescent compound which emits fluorescence or a phosphorescent compound which emits phosphorescence can be used.

Examples of a phosphorescent compound which is used for the light-emitting layer are given below. As a material for bluish light emission, bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium (III)picolinate (abbreviation: FIrpic), bis[2-(3',5'bistrifluoromethylphenyl)pyridinato-N,$C^{2'}$]iridium(III)picolinate (abbreviation: Ir(CF$_3$ppy)$_2$(pic)), bis[2-(4',6'-difluorophenyl)pyridinato-N,$C^{2'}$]iridium(III)acetylacetonate (abbreviation: FIr(acac)) or the like can be given. As a material for greenish light emission, tris(2-phenylpyridinato-N,$C^{2'}$)iridium(III) (abbreviation: Ir(ppy)$_3$), bis[2-phenylpyridinato-N,$C^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato) iridium(III)acetylacetonate (abbreviation: Ir(bzq)$_2$(acac)) or the like can be given. As a material for yellowish light emission, bis(2,4-diphenyl-1,3-oxazolato-N,$C^{2'}$)iridium(III) acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$ (acac)) or the like can be given. As a material for orangish light emission, tris(2-phenylquinolinato-N,$C^{2'}$)iridium(III) (abbreviation: Ir(pq)$_3$), bis(2-phenylquinolinato-N,$C^{2'}$)iridium(III)acetylacetonate (abbreviation: Ir(pq)$_2$(acac)) or the like can be given. As a material for reddish light emission, organometallic complex such as bis[2-(2'-benzo[4,5-α]thienyl)pyridinato-N,C³']iridium(III)acetylacetonate (abbreviation: Ir(btp)₂(acac)), bis(1-phenylisoquinolinato-N,C²')iridium(III)acetylacetonate (abbreviation: Ir(piq)₂(acac)), (acetylacetonato)bis[2,3-bis(4-fluorophenyl)quinoxalinato]iridium(III) (abbreviation: Ir(Fdpq)₂(acac)), or (2,3,7,8,12,13,17,18-octaethyl-21H,23H-porphyrinato)platinum(II) (abbreviation: PtOEP) can be given. In addition, a rare earth metal complex such as tris(acetylacetonato)(monophenanthroline)terbium(III) (abbreviation: Tb(acac)₃(Phen)), tris(1,3-diphenyl-1,3-propanedionato)(monophenanthroline)europium(III) (abbreviation: Eu(DBM)₃(Phen)), or tris[1-(2-thenoyl)-3,3,3-trifluoroacetonato](monophenanthroline)europium(III) (abbreviation: Eu(TTA)₃(Phen)) performs light emission (electron transition between different multiplicities) from a rare earth metal ion; therefore, such a rare earth metal complex can be used as a phosphorescent compound.

Examples of a fluorescent compound which is used for the light-emitting layer are given below. As a material for bluish light emission, N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), or the like can be given. As a material for greenish light emission, N-(9,10-diphenyl-2-anthryl)-N,9-diphenyl-9H-carbazol-3-amine (abbreviation, 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-di(2-biphenylyl)-2-{N-[4-(9H-carbazol-9-yl)phenyl]-N-phenylamino}anthracene (abbreviation: 2YGABPhA), N,N,9-triphenylanthracen-9-amine (abbreviation: DPhAPhA), or the like can be given. As a material for yellowish light emission, rubrene, 5,12-bis(1,1'-biphenyl-4-yl)-6,11-diphenyltetracene (abbreviation: BPT), or the like can be given. As a material for reddish light emission, N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-α]fluoranthene-3,10-diamine (abbreviation: p-mPhAFD), or the like can be given.

Note that the light-emitting layer may have a structure in which any of the above substances having a high light-emitting property (a sixth organic compound) is dispersed into another substance (a fifth organic compound). As the substance into which the substance having a high light-emitting property is dispersed, various kinds of materials can be used, and it is preferable to use a substance whose lowest unoccupied molecular orbital (LUMO) level is higher than that of a substance having a high light-emitting property and whose highest occupied molecular orbital (HOMO) level is lower than that of the substance having a high light-emitting property.

As the substance into which the substance having a high light-emitting property is dispersed, specifically, a metal complex such as tris(8-quinolinolato)aluminum(III) (abbreviation: Alq), tris(4-methyl-8-quinolinolato)aluminum(III) (abbreviation: Almq₃), bis(10-hydroxybenzo[h]quinolinato)beryllium(II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: Zn(BTZ)₂); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 2,2',2"-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazole-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; or the like can be used.

As the substance into which the substance having a high light-emitting property is dispersed, a plurality of kinds of substances can be used. For example, in order to suppress crystallization, a substance for suppressing crystallization such as rubrene or the like may be further added. Furthermore, in order to efficiently transfer energy to the substance having a light-emitting property, NPB, Alq, or the like may be further added.

When a structure in which the substance having a high light-emitting property is dispersed into another substance is employed, crystallization of the light-emitting layer 214 can be suppressed. Further, concentration quenching due to high concentration of the substance having a high light-emitting property can be suppressed.

Note that for the light-emitting layer 214, a high molecular compound can be used. Specifically, as a material for bluish light emission, poly(9,9-dioctylfluorene-2,7-diyl) (abbreviation: POF), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH) or the like can be given. As a material for greenish light emission, poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], or the like can be given. As a material for orangish to reddish light emission, poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD) or the like can be given.

The layer 215 for controlling the electron transport includes a third organic compound and a fourth organic compound, in which the weight percent of the third organic compound is higher than that of the fourth organic compound. That is, the fourth organic compound is dispersed into the third organic compound. The layer 215 for controlling the electron transport is preferably provided between the light-emitting layer 214 and the second electrode 204.

The layer 215 for controlling the electron transport shown in this embodiment mode includes the third organic compound and the fourth organic compound, and the third organic compound and the fourth organic compound transport different kinds of carriers.

In a case where the layer for controlling the electron transport is provided between the light-emitting layer and the second electrode serving as a cathode, the third organic compound is preferably an organic compound having an electron-transporting property, and the fourth organic compound is preferably an organic compound having a hole-transporting property. That is, the third organic compound is preferably a substance whose electron-transporting property is higher than the hole-transporting property, while the fourth organic compound is preferably a substance whose hole-transporting property is higher than the electron-transporting property. In addition, the difference between the lowest unoccupied molecular orbital (LUMO) levels of the third organic compound and the fourth organic compound is preferably less than 0.3 eV, and more preferably 0.2 eV or less. That is, it is preferable that, in thermodynamic terms, electrons, which are carriers, can be easily transported between the third organic compound and the fourth organic compound.

Figure 5:
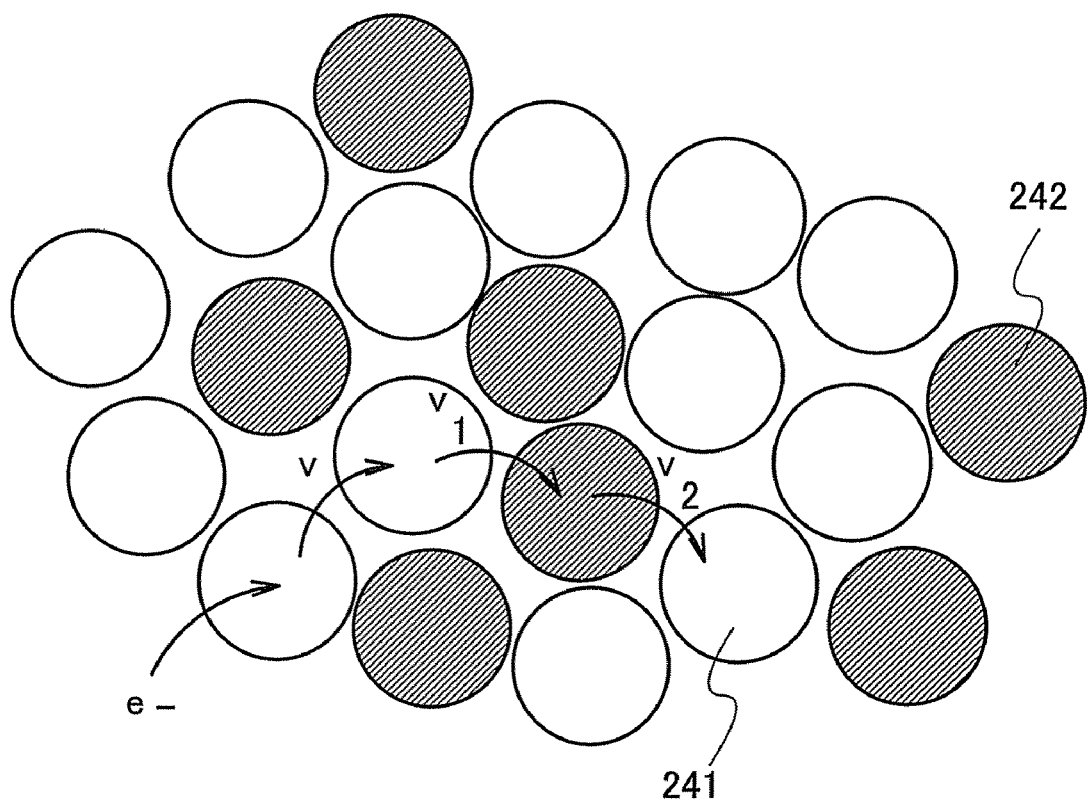
FIG. 5 is a diagram illustrating a light-emitting element of the present invention.

FIG. 5 illustrates a conceptual view of a layer for controlling the electron transport shown in this embodiment mode. In FIG. 5, since a third organic compound 241 has an electron-transporting property, electrons are easily injected thereinto and transported to neighboring third organic compound. That is, the rate at which electrons are injected into the third organic compound and the rate (v) at which the electrons are released from the third organic compound are high.

Meanwhile, in thermodynamic terms, there is a possibility that electrons are injected into a fourth organic compound 242 which is an organic compound having a hole-transporting property because the LUMO level of the fourth organic compound 242 is close to that of the third organic compound 241. However, the rate ($v_1$) at which electrons are injected from the third organic compound 241, which is an organic compound having an electron-transporting property, into the fourth organic compound 242, which is an organic compound having a hole-transporting property, or the rate ($v_2$), at which electrons are injected from the fourth organic compound 242 into the third organic compound 241, is lower than the rate (v) at which electrons are injected from the third organic compound 241 into another third organic compound 241.

Since the fourth organic compound 242 is included, the electron-transporting rate of the layer for controlling the electron transport as a whole is lower than that of a layer including only the third organic compound 241. That is, by adding the fourth organic compound 242, the carrier transport can be controlled. Further, by controlling the concentration of the fourth organic compound 242, the carrier-transporting rate can be controlled.

As described above, the third organic compound is preferably an organic compound having an electron-transporting property in this embodiment mode. Specifically, a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: Zn(BTZ)$_2$), can be used. Further, as an alternative to such a metal complex, a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 2,2',2''-(1,3,5-benzenetriyl)tris(1-phenyl-1H-benzimidazole) (abbreviation: TPBI), bathophenanthroline (abbreviation: BPhen), or bathocuproine (abbreviation: BCP) can be used. Further, a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), or 3,3',3''-(benzene-1,3,5-triyl)tripyrene (abbreviation: TPB3) can be used. Further, a high molecular compound such as poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

The fourth organic compound is preferably an organic compound having a hole-transporting property. Specifically, a condensed aromatic hydrocarbon such as 9,10-diphenylanthracene (abbreviation: DPAnth) or 6,12-dimethoxy-5,11-diphenylchrysene, an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-[4-[4-(10-phenyl-9-anthryl)phenyl]phenyl]-9H-carbazol-3-amine (abbreviation: PCAPBA), N-(9,10-diphenyl-2-anthryl)-N,9-diphenyl-9H-carbazol-3-amine, (abbreviation: 2PCAPA), NPB (or α-NPD), TPD, DFLDPBi, or BSPB, a compound including an amino group such as Coumarin 7, or Coumarin 30, and the like can be used. Further, a high molecular compound such as PVK, PVTPA, PThDMA, or Poly-TPD can be used.

By the above combination, the electron transport from the third organic compound to the fourth organic compound or from the fourth organic compound to the third organic compound is suppressed, whereby the electron-transporting rate in the layer for controlling the carrier transport can be suppressed. Further, the layer for controlling the carrier transport has a structure in which the fourth organic compound is dispersed into the third organic compound; therefore, crystallization or aggregation is hardly caused with time. Accordingly, the above-described effect of suppressing the electron transport is hardly changed with time, and as a result, the carrier balance hardly changes with time. This leads to improvement in lifetime, in other words, improvement in reliability of the light-emitting element.

Note that among the above-described combinations, a metal complex as the third organic compound and an aromatic amine compound as the fourth organic compound are preferably combined. A metal complex has a high electron-transporting property and a large dipole moment, whereas an aromatic amine compound has a high hole-transporting property and a comparatively small dipole moment. In such a manner, by combination of substances dipole moments of which are largely different from each other, the above-described effect of suppressing the electron transport becomes more significant. Specifically, when the magnitude of the dipole moment of the third organic compound is $P_1$ and the magnitude of the dipole moment of the fourth organic compound is $P_2$, a combination which satisfies $P_1/P_2 \geq 3$ or $P_1/P_2 \leq 0.33$ is preferable.

For example, the dipole moment of Alq that is a metal complex is 9.40 debye, and the dipole moment of 2PCAPA that is an aromatic amine compound is 1.15 debye. Accordingly, as in this embodiment mode, when an organic compound having an electron-transporting property like a metal complex is used as the third organic compound and an organic compound having a hole-transporting property like an aromatic amine compound is used as the fourth organic compound, $P_1/P_2 \geq 3$ is preferably satisfied.

In addition, it is preferable that emission colors of the fourth organic compound included in the layer 215 for controlling the electron transport and the substance having a high light-emitting property included in the light-emitting layer 214 be similar colors. Specifically, it is preferable that the difference between the wavelength of the maximum peak of the emission spectrum of the fourth organic compound and that of the substance having a high light-emitting property be 30 nm or less. When the difference between the wavelength of the maximum peak of the emission spectrum of the fourth organic compound and that of the substance having a high light-emitting property is 30 nm or less, the emission colors of the fourth organic compound and the substance having a high light-emitting property can be similar colors. Accordingly, even in a case where the fourth organic compound emits light due to change in voltage or the like, change in emission color can be suppressed. However, the fourth organic compound has no necessity to emit light.

In addition, the thickness of the layer 215 for controlling the electron transport is preferably from 5 nm to 20 nm, inclusive. When the layer 215 for controlling the electron transport is too thick, the carrier-transporting rate becomes too slow, which could result in high driving voltage, in addition, the emission intensity of the layer 215 for controlling the electron transport may increase. When the layer 215 for controlling the carrier transport is too thin, on the other hand, it is impossible to implement the function of controlling the carrier transport. Therefore, the thickness is preferably from 5 nm to 20 nm, inclusive.

On the other hand, in a case of a conventional element where the layer for controlling the electron transport is not provided, electrons injected from the second electrode pass through an electron-injecting layer and an electron-transporting layer to be injected into the light-emitting layer. In a case where the light-emitting layer is a layer having an electron-transporting property, that is, in a case where the material which has the highest weight percent in the light-emitting layer has an electron-transporting property, electrons injected into the light-emitting layer transfer through the light-emitting layer, and may reach a hole-transporting layer. When electrons reach the hole-transporting layer, materials which are included in the hole-transporting layer are degraded, leading deterioration of the light-emitting element.

However, by providing the layer for controlling the electron transport shown in this embodiment mode, electrons that penetrate the light-emitting layer and reach the hole-transporting layer can be suppressed. Therefore, deterioration of the hole-transporting layer, which is caused because electrons reach the hole-transporting layer, can be suppressed. Thus, deterioration of the light-emitting element can be suppressed, and the light-emitting element with a long lifetime can be obtained.

The electron-transporting layer 216 is a layer including a substance having a high electron-transporting property. For example, as a low molecular organic compound, a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZNPBO), or bis[2-(2-benzothiazolyl)phenolato]zinc(II) (abbreviation: Zn(BTZ)$_2$), can be used. Further, as an alternative to such a metal complex, a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 2,2',2''-(1,3,5-benzenetriyl)tris(1-phenyl-1H-benzimidazole) (abbreviation: TPBI), bathophenanthroline (abbreviation: BPhen), or bathocuproine (abbreviation: BCP) can be used. The substances mentioned here mainly have a hole mobility of $10^{-6}$ cm$^2$/Vs or higher. However, other substances than the substances mentioned above may also be used for the electron-transporting layer as long as the electron-transporting properties thereof are higher than the hole-transporting properties thereof. Note that the electron-transporting layer is not limited to a single layer, but two or more layers including the above-mentioned substances may be stacked.

Further, for the electron-transporting layer 216, a high molecular compound can be used. For example, poly[(9,9-dihexylfluorene-2,7-diyl)-co-(pyridine-3,5-diyl)] (abbreviation: PF-Py), poly[(9,9-dioctyllfluorene-2,7-diyl)-co-(2,2'-bipyridine-6,6'-diyl)] (abbreviation: PF-BPy), or the like can be used.

The electron-injecting layer 217 is a layer including a substance having a high electron-injecting property. As a substance having a high electron-injecting property, an alkali metal, an alkaline earth metal, or a compound thereof such as lithium fluoride (LiF), cesium fluoride (CsF), or calcium fluoride (CaF$_2$) can be used. For example, a layer of a substance having an electron-transporting property which further includes an alkali metal, an alkaline earth metal, or a compound thereof; for example, a layer of Alq including magnesium (Mg) can be used. Note that it is preferable to use the layer formed of a substance having an electron-transporting property in which an alkali metal or an alkaline earth metal is mixed as the electron-injecting layer because electrons can be efficiently injected from the second electrode 204.

As a substance for forming the second electrode 204, a metal, an alloy, an electrically conductive compound, or a mixture thereof, or the like with a low work function (specifically, a work function of 3.8 eV or lower is preferable) can be used. Specific examples of such cathode materials are given below: elements belonging to Group 1 and Group 2 of the periodic table, that is, alkali metals such as lithium (Li) and cesium (Cs) and alkaline earth metals such as magnesium (Mg), calcium (Ca), and strontium (Sr); alloys thereof (MgAg, AlLi); rare earth metals such as europium (Eu) and ytterbium (Yb); alloys thereof; and the like. A film of an alkali metal, an alkaline earth metal, or an alloy thereof can be formed by a vacuum evaporation method. In addition, a film of an alloy including an alkali metal or an alkaline earth metal can be formed by a sputtering method. Further, a film can be formed using a silver paste or the like by an inkjet method or the like.

By providing the electron-injecting layer 217 which is a layer having a function of promoting electron injection between the second electrode 204 and the electron-transporting layer 216, the second electrode 204 can be formed using various conductive materials such as Al, Ag, ITO, or indium tin oxide containing silicon or silicon oxide, regardless of their work functions. A film of such a conductive material can be formed by a sputtering method, an inkjet method, a spin coating method, or the like.

Various methods can be used for forming an EL layer, regardless of a dry method or a wet method. For example, a vacuum evaporation method, an inkjet method, a spin coating method, or the like may be used. Further, a different film formation method may be used to form each electrode or each layer.

For example, the EL layer may be formed by a wet method using a high molecular compound selected from the above-mentioned materials. Further, the EL layer can also be formed by a wet method using a low molecular organic compound. Furthermore, the EL layer may be formed by a dry method such as a vacuum evaporation method using a low molecular organic compound.

The electrode may be formed by a wet method using a sol-gel method, or by a wet method using a paste of a metal material. Further, the electrode may be formed by a dry method such as a sputtering method or a vacuum evaporation method.

For example, in a case where a light-emitting element of the present invention is applied to a display device and a light-emitting layer for each color is formed separately, it is preferable to form the light-emitting layer by a wet method. When the light-emitting layer is formed by an inkjet method, it becomes easy to form the light-emitting layers separately for each color even when a large-sized substrate is used.

In a light-emitting element of the present invention having the above-described structure, current flows due to a potential difference generated between the first electrode 202 and the second electrode 204, whereby holes and electrons are recombined in the EL layer 203 and light emission is obtained.

Figure 3A:
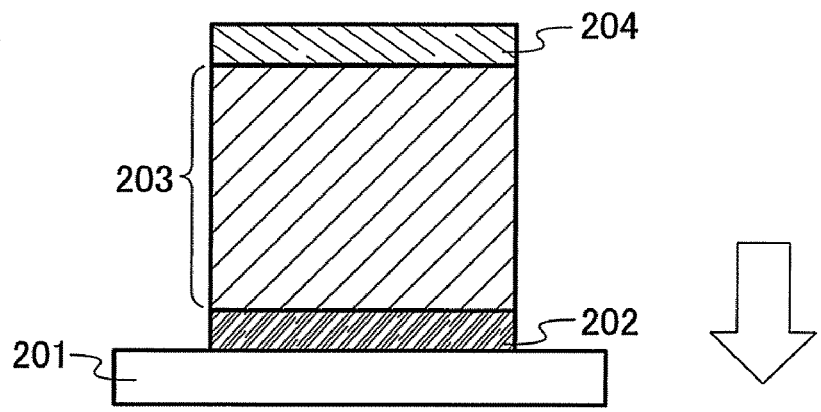
FIGS. 3A to 3C are diagrams each illustrating a light-emitting element of the present invention.
Figure 3B:
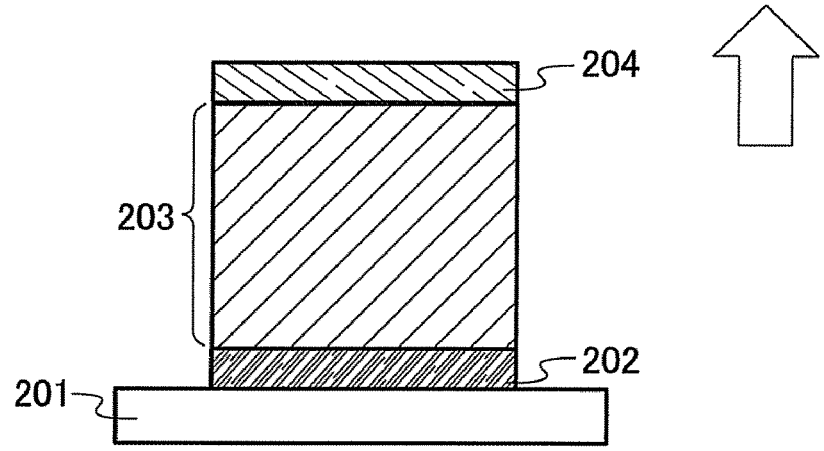
Figure 3C:
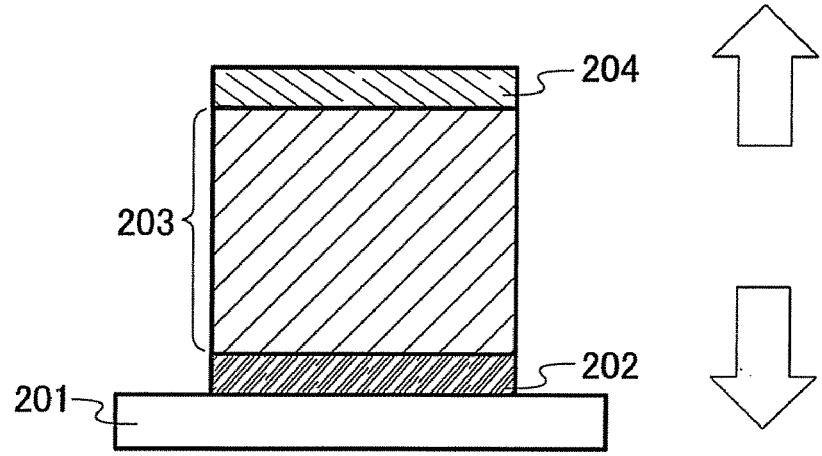

Light emission is extracted to the outside through one of or both the first electrode 202 and the second electrode 204. Accordingly, one of or both the first electrode 202 and the second electrode 204 are electrodes having a light-transmitting property. When only the first electrode 202 has a light-transmitting property, light emission is extracted from the substrate side through the first electrode 202 as illustrated in FIG. 3A. When only the second electrode 204 has a light-transmitting property, light emission is extracted from the opposite side to the substrate through the second electrode 204 as illustrated in FIG. 3B. When both the first electrode 202 and the second electrode 204 have a light-transmitting property, light emission is extracted from both the substrate side and the opposite side to the substrate through the first electrode 202 and the second electrode 204 as illustrated in FIG. 3C.

Note that the structure of the layers provided between the first electrode 202 and the second electrode 204 is not limited to the above structure. Any structure other than the above structure can be employed as long as a light-emitting region for recombination of holes and electrons is positioned away from the first electrode 202 and the second electrode 204 so as to prevent quenching caused by proximity of the light-emitting region to metal, and a layer for controlling the carrier transport is provided.

That is, there is no particular limitation on the stacked structure of the layers, and a layer for controlling the carrier transport and the light-emitting layer shown in this embodiment mode may be combined with a layer formed of a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

Note that since the layer for controlling the hole transport controls the hole transport, the layer for controlling the hole transport is preferably provided between the light-emitting layer and the electrode serving as an anode.

Figure 1B:
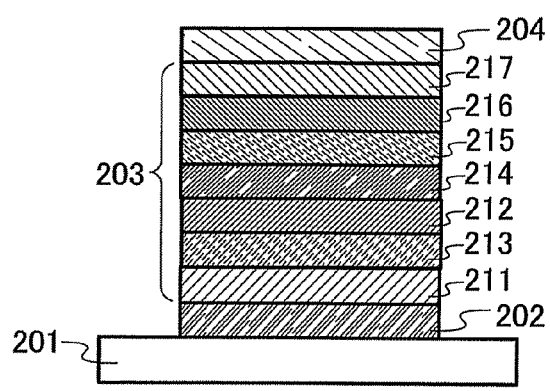
Figure 1C:
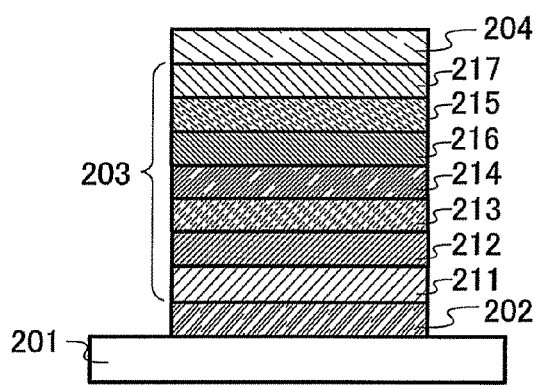

As illustrated in FIGS. 1A and 1C, in a case of a structure where the light-emitting layer 214 and the layer 213 for controlling the hole transport are in contact with each other, as the second organic compound, it is preferable to use an organic compound into which electrons are not easily injected and the band gap thereof is higher than that of an organic compound which has the highest weight percent in the light-emitting layer 214. In a case of a structure where the light-emitting layer 214 and the layer 213 for controlling the hole transport are in contact with each other, the light-emitting layer and the layer for controlling the carrier transport can be successively formed with the same mask which is preferable in manufacturing a full-color display or the like where selective formation of the layer for controlling the carrier transport is needed for each light-emitting element because the manufacture is facilitated.

Figure 1D:
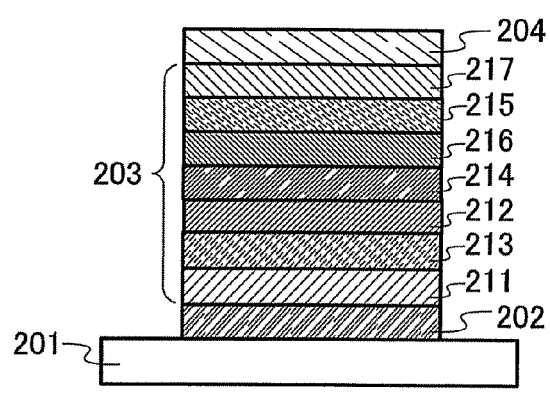
Figure 2A:
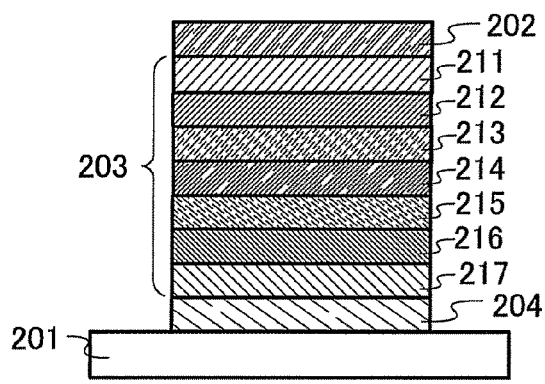
FIGS. 2A to 2D are diagrams each illustrating a light-emitting element of the present invention.
Figure 2B:
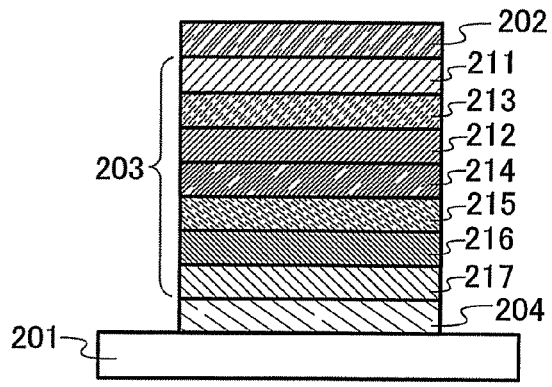
Figure 2C:
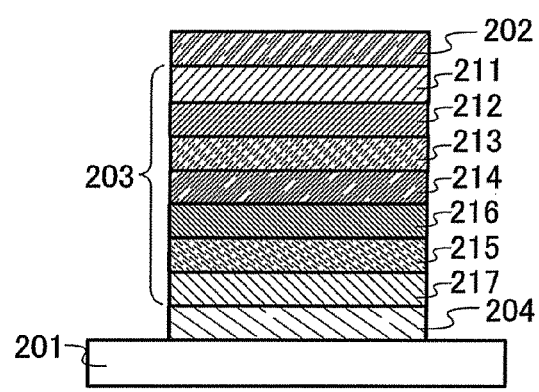
Figure 2D:
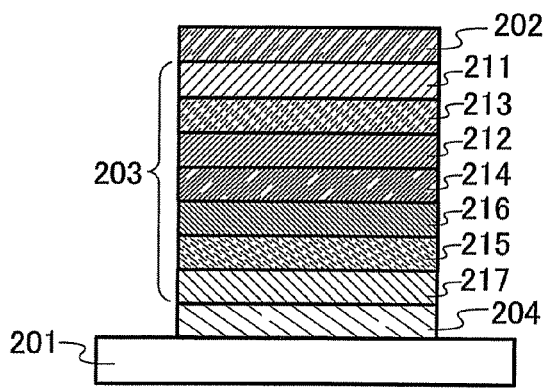

However, as illustrated in FIGS. 1B and 1D, a structure in which a layer is formed between the light-emitting layer 214 and the layer 213 for controlling the hole transport may be employed.

Note that since the layer for controlling the electron transport controls the electron transport, the layer for controlling the electron transport is preferably provided between the light-emitting layer and the electrode serving as a cathode. As illustrated in FIGS. 1A and 1B, a layer for controlling the electron transport is more preferably provided to be in contact with the light-emitting layer. By providing the layer for controlling the electron transport to be in contact with the light-emitting layer, electron injection into the light-emitting layer can be directly controlled. Therefore, change in carrier balance with time in the light-emitting layer can be controlled more efficiently, whereby the lifetime of the element can be more effectively improved. In addition, the process can be simplified.

Note that the layer for controlling the electron transport is preferably provided to be in contact with the light-emitting layer, and in such a case, it is preferable that the third organic compound included in the layer for controlling the electron transport be different from an organic compound which has high weight percent in the light-emitting layer. In particular, in a case where the light-emitting layer includes a substance (a fifth organic compound) for dispersing a substance having a high light-emitting property and a substance having a high light-emitting property (a sixth organic compound), the kinds of the fifth organic compound and the third organic compound are preferably different from each other. In such a structure, the electron transport from the layer for controlling the electron transport to the light-emitting layer is suppressed also between the third organic compound and the fifth organic compound, and thus effect of providing the layer for controlling the electron transport is further increased.

However, as illustrated in FIGS. 1C and 1D, a layer may be formed between the light-emitting layer 214 and the layer 215 for controlling the electron transport.

In addition, as illustrated in FIGS. 2A to 2D, a structure in which the second electrode 204 serving as a cathode, the EL layer 203, and the first electrode 202 serving as an anode are stacked sequentially over the substrate 201 may be employed. The light-emitting element in FIG. 2A has a structure in which the layers of the EL layer in FIG. 1A are stacked in the reverse order, the light-emitting element in FIG. 2B has a structure in which the layers of the EL layer in FIG. 1B are stacked in the reverse order, the light-emitting element in FIG. 2C has a structure in which the layers of the EL layer in FIG. 1C are stacked in the reverse order, and the light-emitting element in FIG. 2D has a structure in which the layers of the EL layer in FIG. 1D are stacked in the reverse order.

Note that in this embodiment mode, the light-emitting element is formed over a substrate made of glass, plastic, or the like. By forming a plurality of such light-emitting elements over a substrate, a passive matrix light-emitting device can be manufactured. Moreover, for example, thin film transistors (TFTs) may be formed over a substrate made of glass, plastic, or the like so that light-emitting elements are manufactured over electrodes which are electrically connected to the TFTs. Thus, an active matrix light-emitting device which controls the driving of a light-emitting element by a TFT can be manufactured. Note that a structure of the TFT is not particularly limited, and either a staggered TFT or an inverted staggered TFT may be used. In addition, a driving circuit formed over a TFT substrate may be formed using an N-channel TFT and a P-channel TFT, or may be formed using either an N-channel TFT or a P-channel TFT. In addition, the crystallinity of a semiconductor film used for the TFT is not particularly limited. Either an amorphous semiconductor film or a crystalline semiconductor film may be used for the TFT. Further, a single crystal semiconductor film may be used. A single crystal semiconductor film can be formed by a Smart Cut (registered trademark) method or the like.

As described above, the light-emitting element shown in this embodiment mode is characterized by having both the layer 213 for controlling the hole transport and the layer 215 for controlling the electron transport.

For example, in a case of a conventional light-emitting element where the layer 213 for controlling the hole transport and the layer 215 for controlling the electron transport are not provided, holes injected from the first electrode 202 pass through the hole-injecting layer 211 and the hole-transporting layer 212 to be injected into the light-emitting layer 214 without the transport being retarded; therefore, part of the holes reach the vicinity of the interface between the light-emitting layer and the electron-transporting layer 216. Thus, holes may reach the electron-transporting layer 216 and deteriorate the electron-transporting layer 216. Due to the deterioration, when the number of holes which reach the electron-transporting layer 216 is increased with time, the recombination probability in the light-emitting layer 214 is reduced with time, which results in reduction in element lifetime (luminance decay with time). Similarly, the electrons injected from the second electrode 204 pass through the electron-injecting layer 217 and the electron-transporting layer 216 to be injected into the light-emitting layer 214 without the transport being retarded; therefore, part of the electrons reach the vicinity of the interface between the hole-transporting layer 212 and the light-emitting layer 214. Thus, electrons may reach the hole-transporting layer 212 and deteriorate the hole-transporting layer 212. Due to the deterioration, when the number of electrons which reach the hole-transporting layer 212 is increased with time, the recombination probability in the light-emitting layer 214 is reduced with time, which results in reduction in element lifetime (luminance decay with time).

On the other hand, as for a light-emitting element of the present invention, by providing the layer 213 for controlling the hole transport, holes injected from the first electrode 202 pass through the hole-injecting layer 211 and the hole-transporting layer 212 to be injected into the layer 213 for controlling the hole transport. The rate of the holes injected into the layer 213 for controlling the hole transport is retarded, and hole injection into the light-emitting layer 214 is controlled. As a result, the possibility that holes may reach and deteriorate the hole-transporting layer 216 is lowered. Note that it is important in the present invention that an organic compound which reduces a hole-transporting property is added to an organic compound having a hole-transporting property, instead of just applying a substance with low hole mobility in the layer 213 for controlling the hole transport. When such a structure is employed, in addition to just controlling hole injection into the light-emitting layer, change in the quantity of controlled hole injection with time can be suppressed.

Further, in a light-emitting element of the present invention, the layer 215 for controlling the electron transport is also provided. In this manner, electrons injected from the second electrode 204 pass through the electron-injecting layer 217 and the electron-transporting layer 216 to be injected into the layer 215 for controlling the electron transport. Here, the layer 215 for controlling the electron transport has a structure in which the fourth organic compound having a hole-transporting property is added to the third organic compound having an electron-transporting property. Therefore, the rate of the electrons injected into the layer 215 for controlling the electron transport is retarded, and electron injection into the light-emitting layer 214 is controlled. As a result, the possibility that electrons may reach and deteriorate the electron-transporting layer 212 is lowered. Similarly, as for holes, the possibility that holes may reach and deteriorate the electron-transporting layer 216 is further lowered since the layer 215 for controlling the electron transport includes the third organic compound having an electron-transporting property. Note that it is important in the present invention that an organic compound which reduces an electron-transporting property is added to an organic compound having an electron-transporting property, instead of just applying a substance with low electron mobility in the layer 215 for controlling the electron transport. When such a structure is employed, in addition to just controlling electron injection into the light-emitting layer 214, change in the quantity of the controlled hole injection with time can be suppressed.

Therefore, by controlling the quantity of injection of both carriers of holes and electrons into the light-emitting layer, a light-emitting element of the present invention can prevent a phenomenon that carrier balance is lost and recombination probability is reduced with time. Thus, the lifetime of the element can be improved (luminance decay with time can be suppressed).

Further, as an effect of the layer 213 for controlling the hole transport, improvement in light emission efficiency can be given. In a case of a conventional element where the layer 213 for controlling the hole transport is not provided, most of the holes injected from the first electrode 202 are injected into the light-emitting layer 214 without the transport being controlled. In a case where the light-emitting layer 214 is a layer having an electron-transporting property, that is, in a case where the material which has the highest weight percent in the light-emitting layer 214 has an electron-transporting property, a light-emitting region is formed in the vicinity of the interface between the light-emitting layer 214 and the hole-transporting layer 212. In addition, there is a possibility that cations are generated by excessive holes in the vicinity of the interface between the light-emitting layer 214 and the hole-transporting layer 212. Since a cation serves as a quencher, light emission efficiency decreases due to cations generated in the vicinity of the light-emitting region.

However, by providing the layer 213 for controlling the hole transport shown in this embodiment mode, formation of cations generated by excessive holes in the light-emitting layer 214 and in the vicinity of the light-emitting layer 214 can be suppressed, and decrease in light emission efficiency can be suppressed. Therefore, a light-emitting element with high light emission efficiency can be obtained.

As described above, the light-emitting element shown in this embodiment mode includes a layer for controlling the carrier transport. Since the layer for controlling the carrier transport includes two or more kinds of substances, carrier balance can be controlled precisely by control of combination, the mixture ratio, the film thickness, or the like of the substances.

Further, since the carrier balance can be controlled by controlling combination, the mixture ratio, the film thickness, or the like of the substances, control of the carrier balance can be easier than a conventional light-emitting element. That is, even if a physical property of the substance itself is not changed, the carrier transport can be controlled by controlling the mixture ratio, the film thickness, or the like.

Among two or more kinds of substances included in the layer for controlling the carrier transport, an organic compound which has lower weight percent than other substances is used for controlling the carrier transport. That is, the carrier transport can be controlled by a component which has lower weight percent than other components included in the layer for controlling the carrier transport. Thus, a light-emitting element with a long lifetime, which does not easily deteriorate, can be realized. That is, change in carrier balance is hardly caused in the light-emitting element as compared with a case where carrier balance is controlled by a single substance. For example, when the carrier transport is controlled by a layer formed of a single substance, a balance of the whole layer is changed by a partial change in morphology, partial crystallization, or the like; therefore, the layer easily deteriorates with time. However, as shown in this embodiment mode, the carrier transport is controlled by a component which has lower weigh percent than other components included in the layer for controlling the carrier transport, whereby an effect of change in morphology, crystallization, aggregation, or the like is reduced, and thus deterioration with time is hardly caused. Thus, a light-emitting element with a long lifetime can be obtained in which reduction of carrier balance with time and reduction in light emission efficiency with time is hardly caused.

Moreover, by controlling the carrier transport at opposing sides of the light-emitting layer, effect of change in morphology, crystallization, aggregation, or the like is further reduced, and thus deterioration with time is hardly caused. Thus, a light-emitting element with a long lifetime can be obtained in which reduction in light emission efficiency with time is hardly caused.

In addition, by controlling the carrier transport at opposing sides of the light-emitting layer, a light-emitting element with a long lifetime can be obtained without depending on a carrier-transporting property of the light-emitting layer. Therefore, a material for the light-emitting layer can be chosen from a wider range, and the light-emitting element can be designed more flexibly.

Note that this embodiment mode can be appropriately combined with another embodiment mode.

Embodiment Mode 2

In this embodiment mode, a mode of a light-emitting element in which a plurality of light-emitting units according to the present invention are stacked (hereinafter this light-emitting element is referred to as a stacked-type light-emitting element) will be described with reference to FIG. 6. This light-emitting element is a stacked-type light-emitting element including a plurality of light-emitting units between a first electrode and a second electrode. Each structure of the light-emitting units can be similar to the structure described in Embodiment Mode 1. In other words, the light-emitting element described in Embodiment Mode 1 is a light-emitting element having one light-emitting unit. In this embodiment mode, a light-emitting element having a plurality of light-emitting units will be described.

Figure 6:
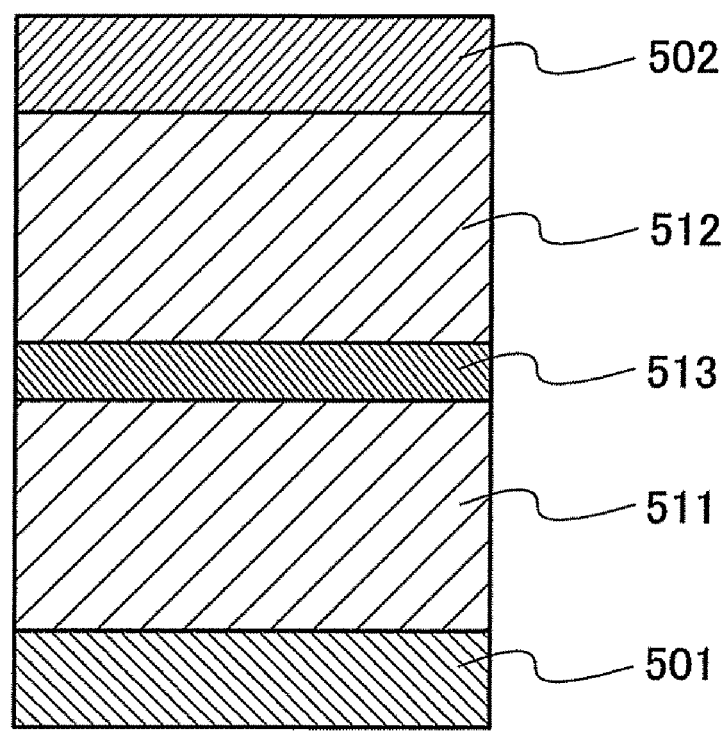
FIG. 6 is a diagram illustrating a light-emitting element of the present invention.

In FIG. 6, a first light-emitting unit 511 and a second light-emitting unit 512 are stacked between a first electrode 501 and a second electrode 502. As the first electrode 501 and the second electrode 502, similar electrodes to the electrode shown in Embodiment Mode 1 can be employed. Note that the first light-emitting unit 511 and the second light-emitting unit 512 may have the same structure or different structures, and as the structures, a similar structure to the structure shown in Embodiment Mode 1 can be employed.

A charge generation layer 513 includes a composite material in which a substance having an acceptor property is mixed into an organic compound. This composite material of an organic compound and a substance having an acceptor property is the composite material described in Embodiment Mode 1 and includes 7,7,8,8-tetracyano-2,3,5,6-tetrafluoroquinodimethane (abbreviation: $F_4$-TCNQ), or metal oxide such as vanadium oxide, molybdenum oxide, or tungsten oxide as a substance having an acceptor property. As an organic compound, any of various compounds such as an aromatic amine compound, a carbazole derivative, an aromatic hydrocarbon, a high molecular compound, an oligomer, a dendrimer, and a polymer can be used. Note that the organic compound having a hole mobility of $10^{-6}$ cm$^2$/Vs or higher is preferably employed as an organic compound. However, other substances than the materials described above may also be used as long as the hole-transporting properties thereof are higher than the electron-transporting properties thereof. A composite of an organic compound and metal oxide is superior in a carrier-injecting property and a carrier-transporting property, and accordingly, low-voltage driving and low-current driving can be realized.

Note that the charge generation layer 513 may be formed with a combination of the composite material of an organic compound and a substance having an acceptor property, and other material. For example, the charge generation layer 513 may be formed with a combination of a layer including the composite material of an organic compound and metal oxide, and a layer including one compound selected from substances having an electron-donating property and a compound having a high electron-transporting property. Further, the charge generation layer 513 may be formed with a combination of a layer including the composite material of an organic compound and metal oxide, and a transparent conductive film. Furthermore, electrode materials shown in Embodiment Mode 1 can be used for the charge generation layer. Note that a layer having a high light-transmitting property is preferably used as the charge generation layer in terms of light extraction efficiency.

In any case, the charge generation layer 513 interposed between the first light-emitting unit 511 and the second light-emitting unit 512 is acceptable as long as electrons are injected into a light-emitting unit on one side and holes are injected into a light-emitting unit on the other side when voltage is applied to the first electrode 501 and the second electrode 502. For example, in a case of applying voltage so that potential of the first electrode is higher than potential of the second electrode, any structure is acceptable for the charge generation layer 513 as long as the charge generation layer 513 injects electrons and holes into the first light-emitting unit 511 and the second light-emitting unit 512, respectively.

Although the light-emitting element having two light-emitting units is described in this embodiment mode, a light-emitting element in which three or more light-emitting units are stacked can be employed in a similar way. Like the light-emitting element of this embodiment mode, a plurality of light emitting units are disposed between a pair of electrodes so as to be partitioned with the charge generation layer, and accordingly, the element with a long lifetime in a high luminance region can be realized while keeping low current density. In a case where the light-emitting element is applied to lighting as an application example, voltage drop due to resistance of an electrode material can be reduced. Accordingly, light can be uniformly emitted in a large area. Moreover, a light-emitting device of low power consumption, which can be driven at low voltage, can be achieved.

The light-emitting units emit light of different colors from each other, thereby obtaining light emission of a desired color as the whole light-emitting element. For example, in a light-emitting element having two light-emitting units, by making the emission colors of the first light-emitting unit and the second light-emitting unit complementary colors, the light-emitting element which emits white light as the whole element can be obtained. Note that "complementary colors" refer to colors which can produce an achromatic color when mixed. That is, white light emission can be obtained by mixing light obtained from substances emitting light of complementary colors. The same can be applied to a light-emitting element having three light-emitting units. For example, when the first light-emitting unit emits red light, the second light-emitting unit emits green light, and the third light-emitting unit emits blue light, white light can be emitted as the whole light-emitting element.

Note that this embodiment mode can be appropriately combined with another embodiment mode.

Embodiment Mode 3

In this embodiment mode, a light-emitting device having a light-emitting element of the present invention will be described.

A light-emitting device having a light-emitting element of the present invention in a pixel portion is described in this embodiment mode with reference to FIGS. 7A and 7B. Note that FIG. 7A is a top view illustrating the light-emitting device and FIG. 7B is a cross-sectional view of FIG. 7A taken along lines A-A' and B-B'. This light-emitting device includes a driver circuit portion (source side driver circuit) 601, a pixel portion 602, and a driver circuit portion (gate side driver circuit) 603, which are indicated by dotted lines, in order to control the light emission of the light-emitting element. Further, reference numeral 604 indicates a sealing substrate and reference numeral 605 indicates a sealing material. A space 607 is provided inside of a portion surrounded by the sealing material 605.

Note that a leading wiring 608 is a wiring for transmitting signals input in the source side driver circuit 601 and the gate side driver circuit 603. The leading wiring 608 receives video signals, clock signals, start signals, reset signals, and the like from an FPC (flexible printed circuit) 609 that serves as an external input terminal. Although only an FPC is illustrated here, this FPC may be provided with a printed wiring board (PWB). The light-emitting device in this specification includes not only a light-emitting device itself but also a light-emitting device with an FPC or a PWB attached thereto.

Then, a cross-sectional structure is described with reference to FIG. 7B. The driver circuit portions and the pixel portion are provided over an element substrate 610. In FIG. 7B, only the source side driver circuit 601, which is the driver circuit portion, and one pixel of the pixel portion 602 are illustrated.

Note that a CMOS circuit which is a combination of an N-channel TFT 623 and a P-channel TFT 624 is provided in the source side driver circuit 601. The driver circuit may be formed by various CMOS circuits, PMOS circuits, or NMOS circuits. In this embodiment mode, a driver-integrated type in which a driver circuit is formed over a substrate is described; however, the present invention is not limited to this, and the driver circuit can be formed outside the substrate.

The pixel portion 602 includes a plurality of pixels each having a switching TFT 611, a current controlling TFT 612, and a first electrode 613 that is electrically connected to a drain of the current controlling TFT 612. Note that an insulator 614 is formed to cover the edge of the first electrode 613. Here, a positive photosensitive acrylic resin film is used to form the insulator 614.

Further, in order to improve the coverage, the insulator 614 is provided such that either an upper edge portion or a lower edge portion of the insulator has a curved surface with a curvature. For example, when positive photosensitive acrylic is used as a material for the insulator 614, it is preferable that only an upper edge portion of the insulator 614 have a curved surface with a radius of curvature (0.2 μm to 3 μm). The insulator 614 can be formed using either negative type that becomes insoluble in an etchant by light irradiation, or positive type that becomes dissoluble in an etchant by light irradiation.

An EL layer 616 and a second electrode 617 are formed over the first electrode 613. Here, various metals, alloys, electrically conductive compounds, or mixtures thereof can be used for a material of the first electrode 613. If the first electrode is used as an anode, it is preferable that the first electrode be formed using a metal, an alloy, an electrically conductive compound, a mixture thereof with a high work function (a work function of 4.0 eV or higher) among such materials. For example, the first electrode 613 can be formed using a single-layer film such as an indium tin oxide film containing silicon, an indium zinc oxide film, a titanium nitride film, a chromium film, a tungsten film, a Zn film, a Pt film, or the like; a stacked film of a titanium nitride film and a film containing aluminum as its main component; or a three-layer structure of a titanium nitride film, a film containing aluminum as its main component, and a titanium nitride film. Note that when a stacked structure is employed, the first electrode 613 has low resistance as a wiring, forms a favorable ohmic contact, and can serve as an anode.

The EL layer 616 is formed by various methods such as an evaporation method using an evaporation mask, an inkjet method, a spin coating method, or the like. The EL layer 616 includes the layer for controlling the carrier transport shown in Embodiment Mode 1 or Embodiment Mode 2. Any of a low molecular compound, a high molecular compound, an oligomer, or a dendrimer may be employed as a material for the EL layer 616. As the material for the EL layer, not only an organic compound but also an inorganic compound may be used.

As the material for the second electrode 617, various types of metals, alloys, electrically conductive compounds, mixtures thereof, or the like can be used. If the second electrode is used as a cathode, it is preferable that the second electrode be formed using an alloy, an electrically conductive compound, a mixture thereof with a low work function (a work function of 3.8 eV or lower) among such materials. For example, elements belonging to Group 1 and Group 2 of the periodic table, that is, alkali metals such as lithium (Li) and cesium (Cs) and alkaline earth metals such as magnesium (Mg), calcium (Ca), and strontium (Sr); alloys thereof (MgAg, AlLi); and the like can be given. In a case where light generated in the EL layer 616 is transmitted through the second electrode 617, the second electrode 617 may also be formed by using a stacked layer of a thin metal film with a reduced film thickness and a transparent conductive film (indium tin oxide (ITO), indium tin oxide containing silicon or silicon oxide, indium zinc oxide (IZO), indium oxide containing tungsten oxide and zinc oxide (IWZO), or the like).

By attaching the sealing substrate 604 to the element substrate 610 with the sealing material 605, the light-emitting element 618 is provided in the space 607 which is surrounded by the element substrate 610, the sealing substrate 604, and the sealing material 605. The space 607 may be filled with a filler, and may be filled with an inert gas (such as nitrogen and argon), the sealing material 605, or the like.

As the sealing material 605, an epoxy-based resin is preferably used. In addition, it is desirable to use a material that allows permeation of moisture or oxygen as little as possible. As the sealing substrate 604, a plastic substrate formed of FRP (fiberglass-reinforced plastics), PVF (polyvinyl fluoride), polyester, acrylic, or the like can be used besides a glass substrate or a quartz substrate.

As described above, the light-emitting device having a light-emitting element of the present invention can be obtained.

A light-emitting device of the present invention has the light-emitting element shown in Embodiment Mode 1 or Embodiment Mode 2. Thus, a light-emitting device with high light emission efficiency can be obtained.

In addition, since the light-emitting element with high light emission efficiency is included, a light-emitting device with low power consumption can be obtained.

Furthermore, since a light-emitting element with less deterioration and a long lifetime is included, a light-emitting device with a long lifetime can be obtained.

Figure 8A:
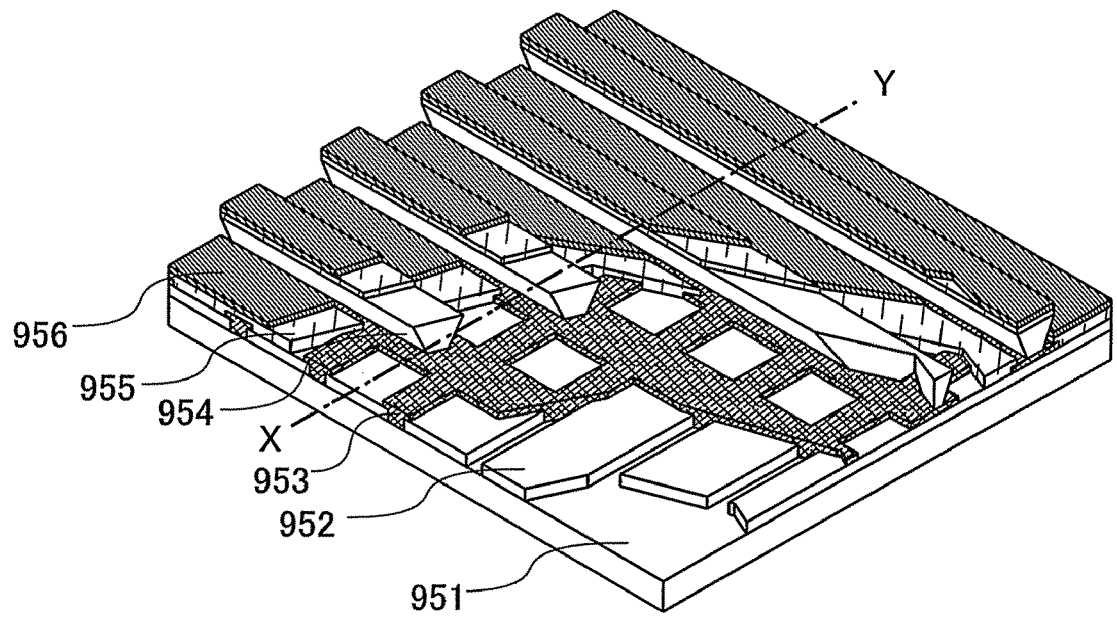
FIGS. 8A and 8B are diagrams illustrating a light-emitting device of the present invention.
Figure 8B:
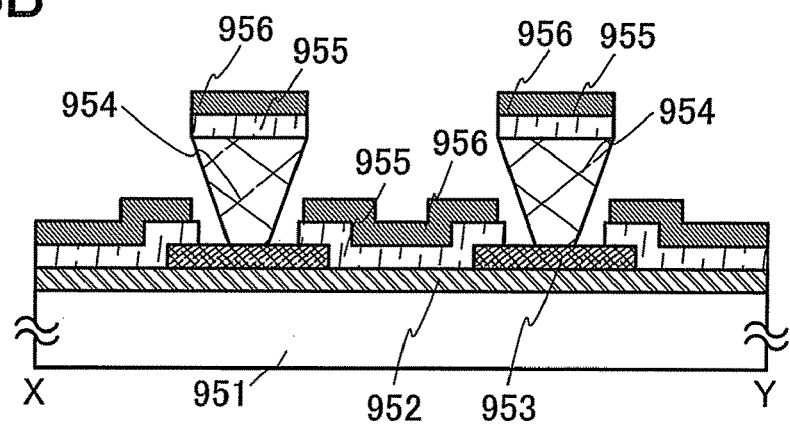

As described above, an active matrix light-emitting device that controls driving of a light-emitting element with a transistor is described in this embodiment mode; however, a passive matrix light-emitting device may be used. FIGS. 8A and 8B illustrate a perspective view of a passive matrix light-emitting device manufactured according to the present invention. Note that FIG. 8A is a perspective view of the light-emitting device and FIG. 8B is a cross-sectional view of FIG. 8A taken along a line X-Y. In FIGS. 8A and 8B, an EL layer 955 is provided between an electrode 952 and an electrode 956 over a substrate 951. The edge of the electrode 952 is covered with an insulating layer 953. A partition layer 954 is provided over the insulating layer 953. The sidewalls of the partition layer 954 slope so that the distance between one sidewall and the other sidewall is gradually reduced toward the surface of the substrate. In other words, a cross section taken in the direction of the short side of the partition layer 954 is quadrilateral, and the lower side (a side in contact with the insulating layer 953) is shorter than the upper side (an opposite side of the lower side). A cathode can be patterned by providing the partition layer 954 in this manner. In addition, in a passive matrix light-emitting device, a light-emitting device with high light emission efficiency can be obtained by including a light-emitting element with high light emission efficiency of the present invention.

A light-emitting device of the present invention has the light-emitting element shown in Embodiment Mode 1 or Embodiment Mode 2. Thus, a light-emitting device with high light emission efficiency can be obtained.

In addition, since the light-emitting element with high light emission efficiency is included, a light-emitting device with low power consumption can be obtained.

Furthermore, since a light-emitting element with less deterioration and a long lifetime is included, a light-emitting device with a long lifetime can be obtained.

Note that this embodiment mode can be appropriately combined with another embodiment mode.

Embodiment Mode 4

In this embodiment mode, an electronic device of the present invention which includes the light-emitting device shown in Embodiment Mode 3 will be described. An electronic device of the present invention has the light-emitting element described in Embodiment Mode 1 or Embodiment Mode 2, and a display portion with high light emission efficiency and low power consumption. In addition, the display portion has a long lifetime.

As an electronic device manufactured using a light-emitting device of the present invention, cameras such as a video camera and a digital camera, a goggle type display, a navigation system, an audio reproducing device (a car audio set, an audio component set, or the like), a computer, a game machine, a portable information terminal (a mobile computer, a cellular phone, a portable game machine, an electronic book reader, or the like), an image reproducing device provided with a recording medium (specifically, a device provided with a display device that can reproduce a recording medium and display the image such as a digital versatile disc (DVD)), and the like are given. Specific examples of these electronic devices are illustrated in FIGS. 9A to 9D.

Figure 9A:
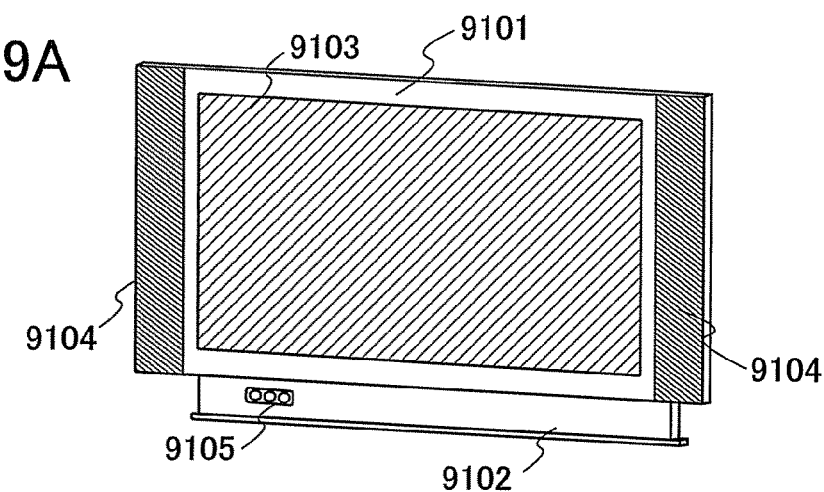
FIGS. 9A to 9D are diagrams each illustrating an electronic device of the present invention.

FIG. 9A illustrates a television device of this embodiment mode that includes a housing 9101, a support 9102, a display portion 9103, speaker portions 9104, a video input terminal 9105, and the like. In the display portion 9103 of this television device, light-emitting elements similar to those described in Embodiment Modes 1 or Embodiment Mode 2 are arranged in matrix. One feature of the light-emitting element is that light emission efficiency is high and power consumption is low. Further, the light-emitting element has a long lifetime. The display portion 9103 which includes the light-emitting element has similar features. Therefore, in this television device, image quality is hardly deteriorated and low power consumption is achieved. With such features, deterioration compensation function and a power supply circuit can be significantly reduced or downsized in the television device; therefore, reduction in size and weight of the housing 9101 and the support 9102 can be achieved. In the television device of this embodiment mode, low power consumption, high image quality, and reduction in size and weight are achieved; therefore, a product which is suitable for living environment can be provided.

Figure 9B:
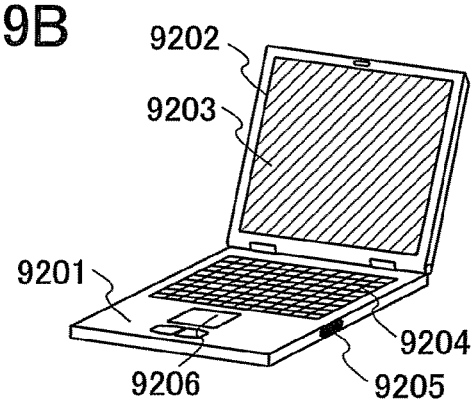

FIG. 9B illustrates a computer of this embodiment mode that includes a main body 9201, a housing 9202, a display portion 9203, a keyboard 9204, an external connection port

9205, a pointing device 9206, and the like. In the display portion 9203 of this computer, light-emitting elements similar to those described in Embodiment Mode 1 or Embodiment Mode 2 are arranged in matrix. One feature of the light-emitting element is that light emission efficiency is high and power consumption is low. Further, the light-emitting element has a long lifetime. The display portion 9203 which includes the light-emitting elements has similar features. Therefore, in the computer, image quality is hardly deteriorated and lower power consumption is achieved. With such features, deterioration compensation function and a power supply circuit can be significantly reduced or downsized in the computer; therefore, reduction in size and weight of the main body 9201 and the housing 9202 can be achieved. In the computer of this embodiment mode, low power consumption, high image quality, and reduction in size and weight are achieved; therefore, a product which is suitable for environment can be provided. Moreover, the computer can be carried and the computer having the display portion which has strong resistance to external impact when being carried can be provided.

Figure 9C:
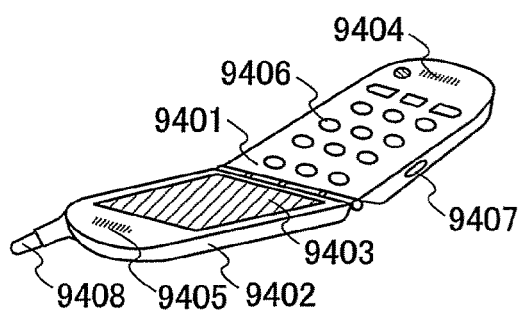

FIG. 9C illustrates a cellular phone of this embodiment mode that includes a main body 9401, a housing 9402, a display portion 9403, an audio input portion 9404, an audio output portion 9405, operation keys 9406, an external connection port 9407, an antenna 9408, and the like. In the display portion 9403 of this cellular phone, light-emitting elements similar to those described in Embodiment Mode 1 or Embodiment Mode 2 are arranged in matrix. One feature of the light-emitting element is that light emission efficiency is high and power consumption is low. Further, the light-emitting element has a long lifetime. The display portion 9403 which includes the light-emitting elements has similar features. Therefore, in the cellular phone, image quality is hardly deteriorated and lower power consumption is achieved. With such features, deterioration compensation function and a power supply circuit can be significantly reduced or downsized in the cellular phone; therefore, reduction in size and weight of the main body 9401 and the housing 9402 can be achieved. In the cellular phone of this embodiment mode, low power consumption, high image quality, and reduction in size and weight are achieved; therefore, a product which is suitable for being carried can be provided. Further, the present invention can provide a product, a display portion of which is resistant to impact even when being carried.

Figure 9D:
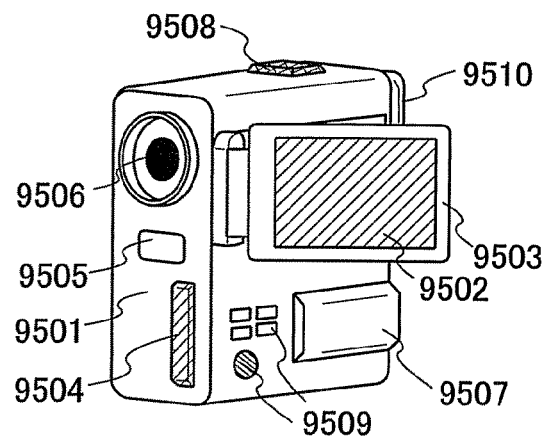

FIG. 9D illustrates a camera that includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. In the display portion 9502 of this camera, light-emitting elements similar to those described in Embodiment Modes 1 or Embodiment Mode 2 are arranged in matrix. One feature of the light-emitting element is that light emission efficiency is high and power consumption is low. Further, the light-emitting element has a long lifetime. The display portion 9502 which includes the light-emitting elements has similar features. Therefore, in the camera, image quality is hardly deteriorated and lower power consumption is achieved. With such features, deterioration compensation function and a power supply circuit can be significantly reduced or downsized in the camera, thereby achieving reduction in size and weight of the main body 9501. In the camera of this embodiment mode, low power consumption, high image quality, and reduction in size and weight are achieved; therefore, a product which is suitable for being carried can be provided. Further, the present invention can provide a product, a display portion of which is resistant to impact even when being carried.

Figure 10:
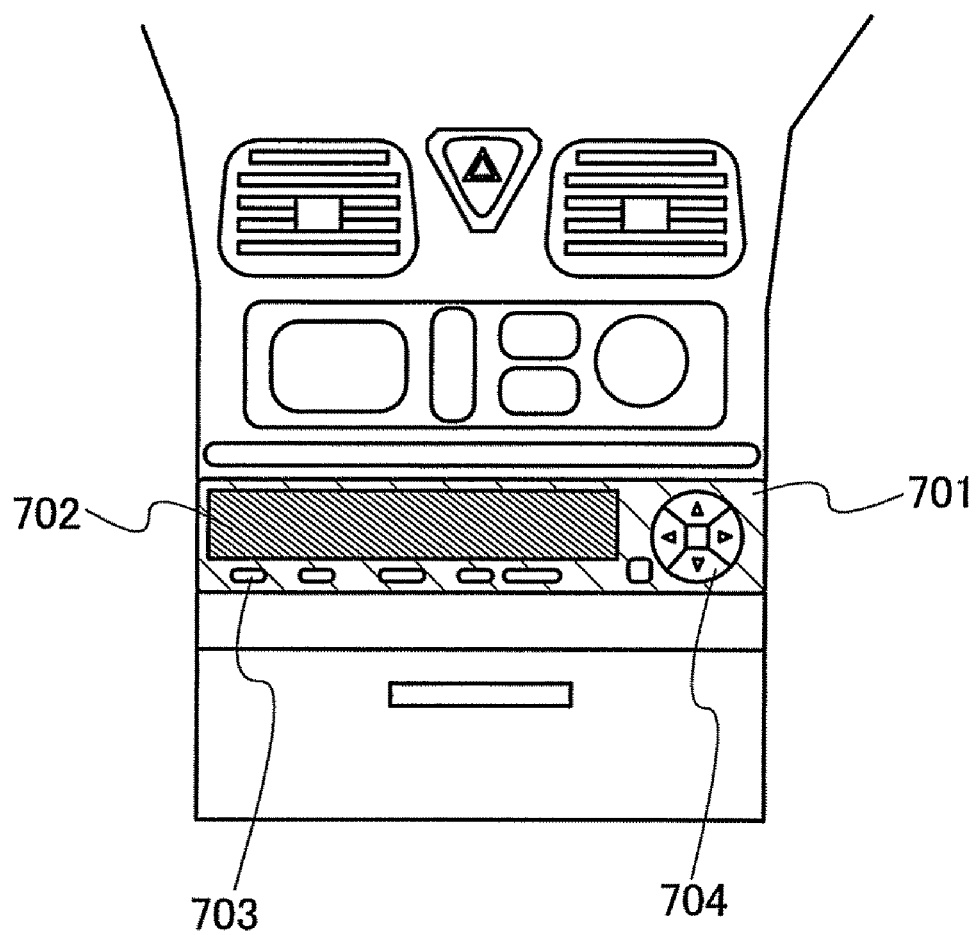
FIG. 10 is a diagram illustrating an electronic device of the present invention.

FIG. 10 illustrates an audio reproducing device, specifically, a car audio system. The audio reproducing device includes a main body 701, a display portion 702, and operation switches 703 and 704. The display portion 702 can be realized by the light-emitting device (passive matrix or active matrix) described in Embodiment Mode 2. Further, the display portion 702 may be formed using a segment type light-emitting device. In any case, the use of a light-emitting element of the present invention makes it possible to form a bright display portion with a long lifetime while achieving low power consumption which uses a vehicle power source (12 to 42 V). Further, although this embodiment mode describes an in-car audio system, a light-emitting device of the present invention may also be used in portable audio systems or audio systems for home use.

Figure 11:
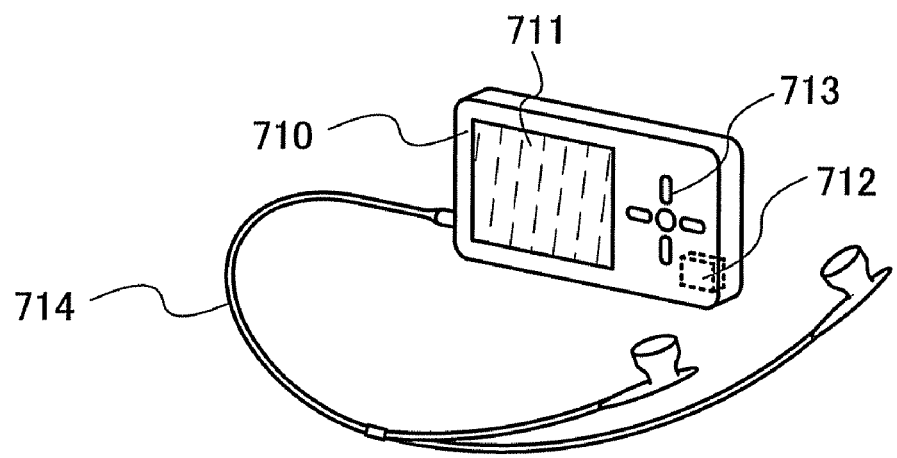
FIG. 11 is a diagram illustrating an electronic device of the present invention.

FIG. 11 illustrates a digital player as one example of that. The digital player illustrated in FIG. 11 includes a main body 710, a display portion 711, a memory portion 712, an operation portion 713, earphones 714, and the like. Note that a pair of headphones or a pair of wireless earphones can be used instead of the pair of earphones 714. The display portion 711 can be realized by the light-emitting device (passive matrix or active matrix) described in Embodiment Mode 2. Further, the display portion 711 may be formed using a segment type light-emitting device. In any case, by using a light-emitting element of the present invention, a display portion can be formed that is capable of displaying images even when using a secondary battery (a nickel-hydrogen battery or the like), has a long lifetime, is bright, and achieves low power consumption. As the memory portion 712, a hard disk or a non-volatile memory is used. For example, a NAND type non-volatile memory with a recording capacity of 20 to 200 gigabytes (GB) is used, and by operating the operation portion 713, an image or a sound (music) can be recorded and reproduced. Note that in the display portion 711, white characters are displayed against a black background, and thus, power consumption can be reduced. This is particularly effective for portable audio systems.

As described above, the applicable range of the light-emitting device manufactured by applying the present invention is so wide that the light-emitting device is applicable to electronic devices in various fields. By applying the present invention, an electronic device which has a display portion consuming low power and having high reliability can be manufactured.

A light-emitting device to which the present invention is applied has a light-emitting element with high light emission efficiency, and can also be used as a lighting device. One mode of using a light-emitting element to which the present invention is applied as a lighting device is described with reference to FIG. 12.

Figure 12:
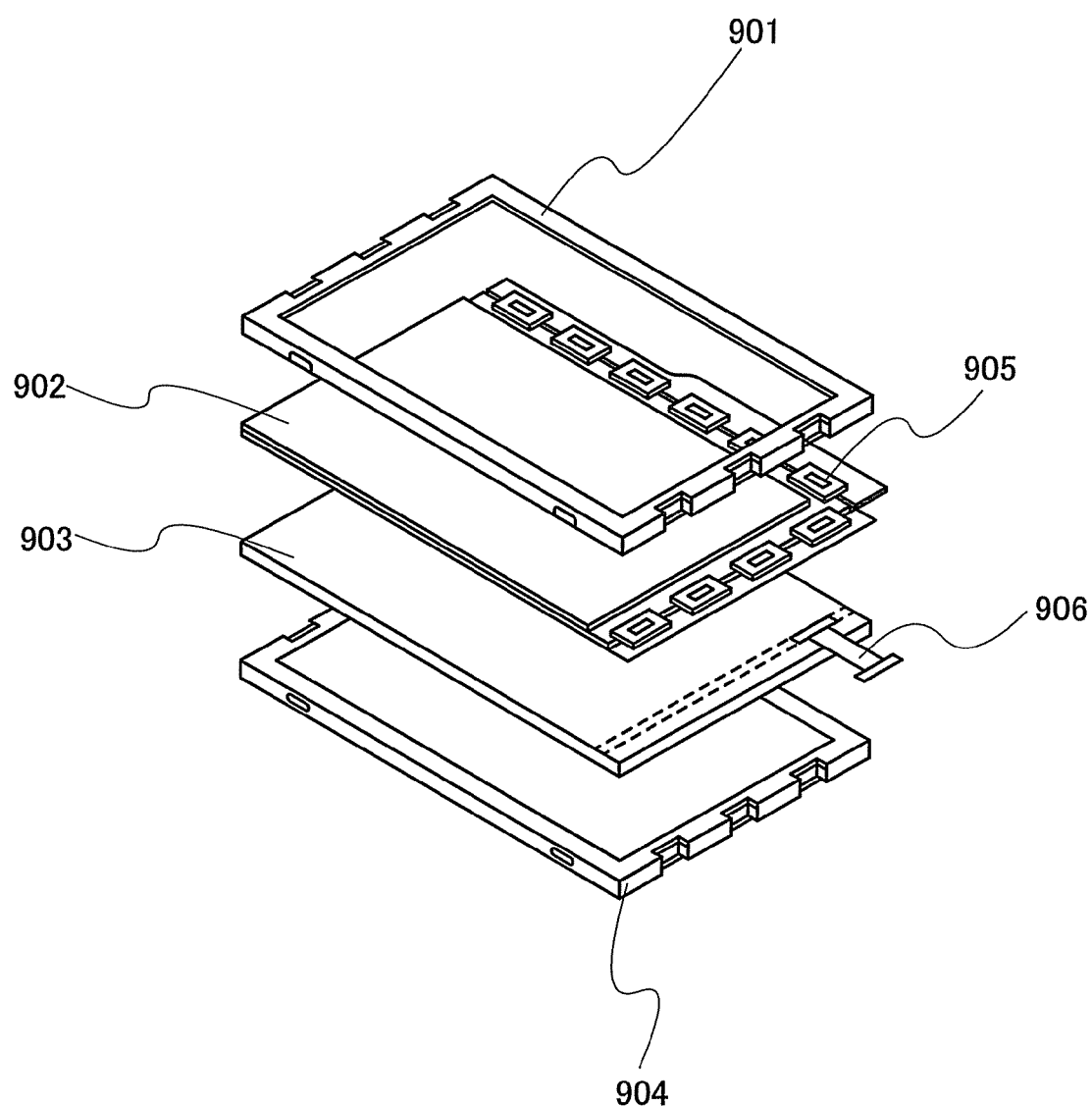
FIG. 12 is a diagram illustrating an electronic device of the present invention.

FIG. 12 illustrates an example of a liquid crystal display device using a light-emitting device of the present invention as a backlight. The liquid crystal display device illustrated in FIG. 12 includes a housing 901, a liquid crystal layer 902, a backlight 903, and a housing 904. The liquid crystal layer 902 is connected to a driver IC 905. A light-emitting device of the present invention is used as the backlight 903, and current is supplied through a terminal 906.

By using a light-emitting device of the present invention as a backlight of the liquid crystal display device, the backlight can have high light emission efficiency. In addition, a backlight with a long lifetime can be obtained. A light-emitting device of the present invention is a plane emission type lighting device, and can have a large area. Therefore, the backlight can have a large area, and a liquid crystal display device having a large area can be obtained. Furthermore, a light-emitting device of the present invention has a thin shape and consumes low power; therefore, a thin shape and low power consumption of a display device can also be achieved.

Figure 13:
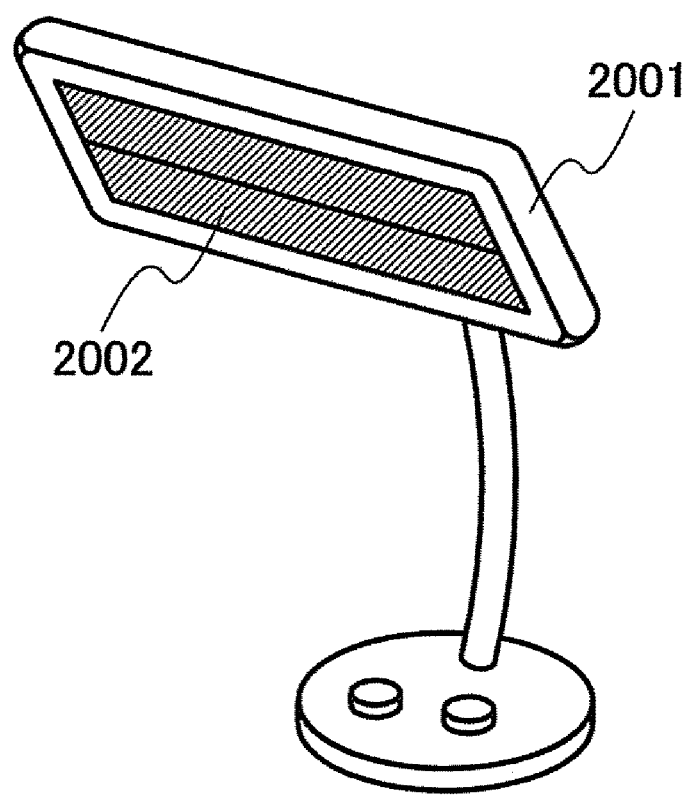
FIG. 13 is a diagram illustrating a lighting device of the present invention.

FIG. 13 illustrates an example in which a light-emitting device to which the present invention is applied is used as a desk lamp, which is one of lighting devices. The desk lamp illustrates in FIG. 13 includes a housing 2001 and a light source 2002, and a light-emitting device of the present invention is used as the light source 2002. Since a light-emitting device of the present invention has a long lifetime, the desk lamp can also have a long lifetime.

Figure 14:
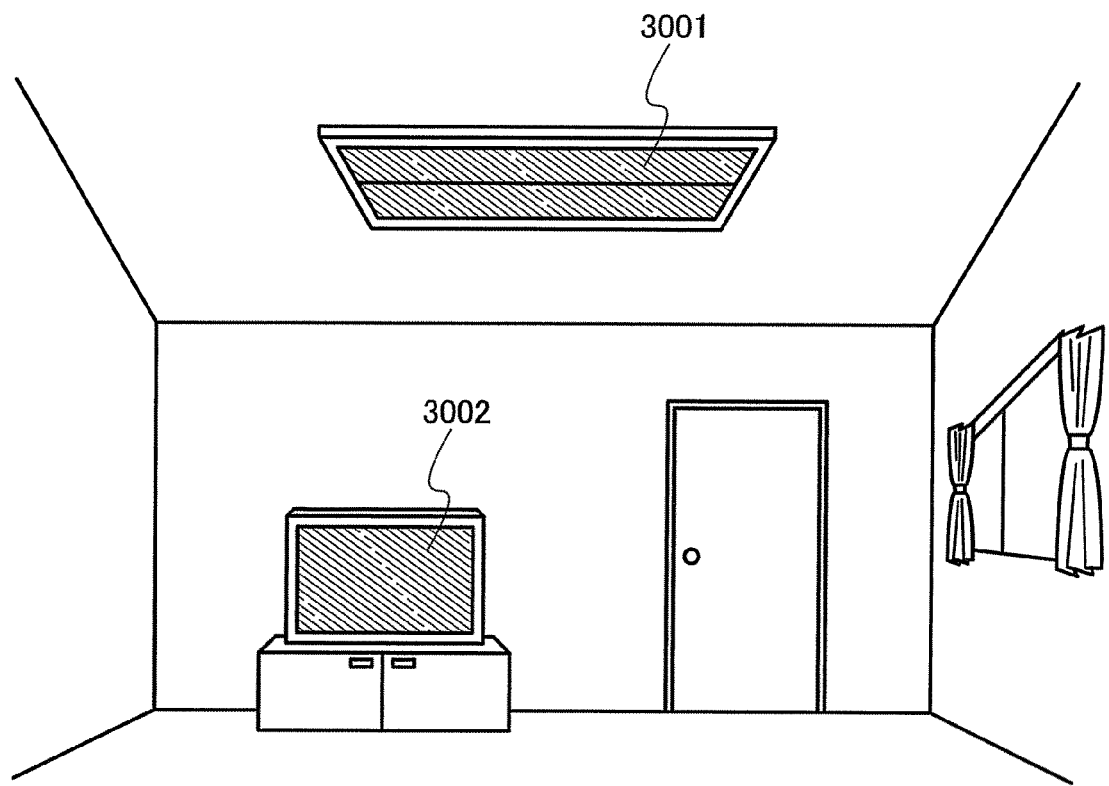
FIG. 14 is a diagram illustrating a lighting device of the present invention.

FIG. 14 illustrates an example in which a light-emitting device to which the present invention is applied is used as an interior lighting device 3001. Since a light-emitting device of the present invention can also have a large area, a light-emitting device of the present invention can be used as a lighting device having a large emission area. Moreover, since a light-emitting device of the present invention has a long lifetime, the lighting device can also have a long lifetime. A television device 3002 of the present invention such as that illustrated in FIG. 9A may be placed in a room where a light-emitting device to which the invention is applied is used as the interior lighting device 3001, and public broadcasting or movies can be watched there. In such a case, since both of the devices have long lifetimes, frequency of replacement of the lighting device and the television device can be reduced, and environmental load can be reduced.

Note that this embodiment can be appropriately combined with another embodiment mode.

This application is based on Japanese Patent Application Serial No. 2007-243273 filed with Japan Patent Office on Sep. 20, 2007, the entire contents of which are hereby incorporated by reference.

What is claimed is:

1. A light-emitting element comprising:
a light-emitting layer between an anode and a cathode;
a first layer between the light-emitting layer and the anode; and
a second layer between the light-emitting layer and the cathode,
wherein the first layer comprises a first organic compound having a hole-transporting property and a second organic compound having a hole-trapping property,
wherein a weight percent of the first organic compound is higher than a weight percent of the second organic compound,
wherein the second layer comprises a third organic compound having an electron-transporting property and a fourth organic compound having a hole-transporting property, and
wherein a weight percent of the third organic compound is higher than a weight percent of the fourth organic compound.

2. The light-emitting element according to claim 1, wherein a highest occupied molecular orbital level of the second organic compound is higher than a highest occupied molecular orbital level of the first organic compound by 0.3 eV or more.

3. The light-emitting element according to claim 1, wherein the first organic compound is an aromatic amine compound.

4. The light-emitting element according to claim 1, wherein a thickness of the first layer is 5 nm to 20 nm, inclusive.

5. The light-emitting element according to claim 1, wherein the first layer is in contact with the light-emitting layer.

6. The light-emitting element according to claim 1, wherein a difference between a lowest unoccupied molecular orbital level of the third organic compound and a lowest unoccupied molecular orbital level of the fourth organic compound is less than 0.3 eV.

7. The light-emitting element according to claim 1, wherein the third organic compound is a metal complex, and
wherein the fourth organic compound is an aromatic amine compound.

8. The light-emitting element according to claim 1, wherein $P_1/P_2 \geqq 3$ or $P_1/P_2 \leqq 0.33$ is satisfied where $P_1$ is a dipole moment of the third organic compound and $P_2$ is a dipole moment of the fourth organic compound.

9. The light-emitting element according to claim 1, wherein a thickness of the second layer is from 5 nm to 20 nm, inclusive.

10. The light-emitting element according to claim 1, wherein the second layer is in contact with the light-emitting layer.

11. An electronic device comprising the light-emitting element according to claim 1, the electronic device further comprising a display portion,
wherein the display portion is provided with the light-emitting element.

12. A light-emitting element comprising:
a first electrode;
a second electrode; and
a plurality of light-emitting units between the first electrode and the second electrode,
wherein at least one of the plurality of light-emitting units comprises:
a first layer comprising a first organic compound having a hole-transporting property and a second organic compound having a hole-trapping property;
a second layer comprising a third organic compound having an electron-transporting property and a fourth organic compound having a hole-transporting property; and
a light-emitting layer interposed between the first layer and the second layer,
wherein a weight percent of the first organic compound is higher than a weight percent of the second organic compound, and
wherein a weight percent of the third organic compound is higher than a weight percent of the fourth organic compound, and
wherein the plurality of light-emitting units are stacked.

13. A light-emitting element according to claim 12, wherein each of the light-emitting units is the same structure.

14. A light-emitting element according to claim 12, wherein the light-emitting element emits white light.

15. The light-emitting element according to claim 12, wherein a highest occupied molecular orbital level of the second organic compound is higher than a highest occupied molecular orbital level of the first organic compound by 0.3 eV or more.

16. The light-emitting element according to claim 12, wherein the first organic compound is an aromatic amine compound.

17. The light-emitting element according to claim 12,
wherein the first layer is in contact with the light-emitting layer.

18. The light-emitting element according to claim 12,
wherein a difference between a lowest unoccupied molecular orbital level of the third organic compound and a lowest unoccupied molecular orbital level of the fourth organic compound is less than 0.3 eV.

19. The light-emitting element according to claim 12,
wherein the third organic compound is a metal complex, and
wherein the fourth organic compound is an aromatic amine compound.

20. The light-emitting element according to claim 12,
wherein $P_1/P_2 \geq 3$ or $P_1/P_2 \leq 0.33$ is satisfied where $P_1$ is a dipole moment of the third organic compound and $P_2$ is a dipole moment of the fourth organic compound.

21. The light-emitting element according to claim 12,
wherein the second layer is in contact with the light-emitting layer.

22. A light-emitting element comprising:
an anode;
a hole-injecting layer over the anode;
a light-emitting layer over the hole-injecting layer;
an electron-injecting layer over the light-emitting layer; and
a cathode over the electron-injecting layer,
wherein a hole-transporting layer and a first layer are provided between the hole-injecting layer and the light-emitting layer,
wherein an electron-transporting layer and a second layer are provided between the electron-injecting layer and the light-emitting layer,
wherein the first layer comprises a first organic compound having a hole-transporting property and a second organic compound having a hole-trapping property,
wherein a weight percent of the first organic compound is higher than a weight percent of the second organic compound,
wherein the second layer comprises a third organic compound having an electron-transporting property and a fourth organic compound having a hole-transporting property, and
wherein a weight percent of the third organic compound is higher than a weight percent of the fourth organic compound.

23. A light-emitting element according to claim 22,
wherein the first layer is over the hole-transporting layer, and
wherein the electron-transporting layer is over the second layer.

24. A light-emitting element according to claim 22,
wherein the hole-transporting layer is over the first layer, and
wherein the electron-transporting layer is over the second layer.

25. A light-emitting element according to claim 22,
wherein the first layer is over the hole-transporting layer, and
wherein the second layer is over the electron-transporting layer.

26. A light-emitting element according to claim 22,
wherein the hole-transporting layer is over the first layer, and
wherein the second layer is over the electron-transporting layer.

27. The light-emitting element according to claim 22,
wherein a highest occupied molecular orbital level of the second organic compound is higher than a highest occupied molecular orbital level of the first organic compound by 0.3 eV or more.

28. The light-emitting element according to claim 22,
wherein the first organic compound is an aromatic amine compound.

29. The light-emitting element according to claim 22,
wherein a thickness of the first layer is 5 nm to 20 nm, inclusive.

30. The light-emitting element according to claim 22,
wherein the first layer is in contact with the light-emitting layer.

31. The light-emitting element according to claim 22,
wherein a difference between a lowest unoccupied molecular orbital level of the third organic compound and a lowest unoccupied molecular orbital level of the fourth organic compound is less than 0.3 eV.

32. The light-emitting element according to claim 22,
wherein the third organic compound is a metal complex, and
wherein the fourth organic compound is an aromatic amine compound.

33. The light-emitting element according to claim 22,
wherein $P_1/P_2 \geq 3$ or $P_1/P_2 \leq 0.33$ is satisfied where $P_1$ is a dipole moment of the third organic compound and $P_2$ is a dipole moment of the fourth organic compound.

34. The light-emitting element according to claim 22,
wherein a thickness of the second layer is from 5 nm to 20 nm, inclusive.

35. The light-emitting element according to claim 22,
wherein the second layer is in contact with the light-emitting layer.

36. An electronic device comprising the light-emitting element according to claim 22, the electronic device further comprising a display portion,
wherein the display portion is provided with the light-emitting element.

37. The light-emitting element according to claim 1,
wherein the first organic compound and the second organic compound are mixed, and
wherein the third organic compound and the fourth organic compound are mixed.

38. The light-emitting element according to claim 12,
wherein the first organic compound and the second organic compound are mixed, and
wherein the third organic compound and the fourth organic compound are mixed.

39. The light-emitting element according to claim 22,
wherein the first organic compound and the second organic compound are mixed, and
wherein the third organic compound and the fourth organic compound are mixed.

40. A lighting device comprising the light-emitting element according to claim 1.

41. A lighting device comprising the light-emitting element according to claim 12.

42. A lighting device comprising the light-emitting element according to claim 22.

* * * * *